(12) United States Patent  (10) Patent No.: US 8,013,316 B2
Eleftheriades  (45) Date of Patent: Sep. 6, 2011

(54) METALLIC SCREENS FOR SUB-WAVELENGTH FOCUSING OF ELECTROMAGNETIC WAVES

(76) Inventor: George V. Eleftheriades, Scarborough (CA)

( * ) Notice: Subject to any disclaimer, the term of this patent is extended or adjusted under 35 U.S.C. 154(b) by 241 days.

(21) Appl. No.: 12/328,363

(22) Filed: Dec. 4, 2008

(65) Prior Publication Data

US 2009/0230333 A1 Sep. 17, 2009

Related U.S. Application Data

(60) Provisional application No. 61/036,919, filed on Mar. 14, 2008, provisional application No. 61/048,124, filed on Apr. 25, 2008.

(51) Int. Cl.
*G02B 5/00* (2006.01)
*G21K 1/00* (2006.01)
*H01J 1/52* (2006.01)

(52) U.S. Cl. ............... 250/505.1; 219/121.71; 343/909; 359/642

(58) Field of Classification Search ............... 250/505.1; 219/121.71; 343/909; 359/642
See application file for complete search history.

(56) References Cited

U.S. PATENT DOCUMENTS

2009/0303154 A1* 12/2009 Grbic et al. ............... 343/909

OTHER PUBLICATIONS

Wong, A.M.H. et al., Metallic Transmission Screen for Sub-Wavelength Focusing, Electronic Letters, Dec. 6, 2007, pp. 1402-1404, vol. 43.
Markley, L. et al., Two-Dimensional Subwavelength Focusing Using a Slotted Meta-Screen, IEEE Microwave and Wireless Components Letters.
Eleftheriades, George V. et al., Holography-Inspired Screens for Sub-Wavelength Focusing in the Near Field, IEEE Microwave and Wireless Components Letters, Apr. 2008, pp. 236-238, vol. 18, No. 4.
Grbic, Anthony et al., Near-Field Plates: Subdiffraction focusing with Patterned Surfaces, Science, Apr. 25, 2008, pp. 511-513, vol. 320.
Merlin, R., Radiationless Electromagnetic Interference: Evanescent-Field Lenses and Perfect Focusing, Science, Aug. 17, 2007, pp. 927-929, vol. 317.

* cited by examiner

*Primary Examiner* — Robert Kim
*Assistant Examiner* — Meenakshi S Sahu
(74) *Attorney, Agent, or Firm* — Miller Thomson; Stephen R. Burri

(57) ABSTRACT

A method and apparatus for near-field focusing of an incident wave, over a range of frequencies from microwaves to optical frequencies, into a sub-wavelength spot having a peak-to-null beamwidth of $\lambda/10$. The screen may be made out of closely spaced, unequal slots cut on a metallic sheet. Nano-scale focusing capability may be achieved with a simple structure of three slots on a metallic sheet, which can be readily implemented using current nanofabrication technologies. Unlike negative-refractive-index focusing implementations, this "meta-screen" does not suffer from image degradation when losses are introduced and is easily scalable from microwave to Terahertz frequencies and beyond. The slotted geometry is designed using a theory of shifted beams to determine the necessary weighting factors for each slot element, which are then converted to appropriate slot dimensions.

25 Claims, 18 Drawing Sheets

(a)

(b)

METALLIC SCREENS FOR SUB-WAVELENGTH FOCUSING OF ELECTROMAGNETIC WAVES

BACKGROUND OF THE INVENTION

There have been many recent efforts to develop structures for focusing electromagnetic waves into sub-wavelength spots in the near-field [A. Salandrino, and Engheta, "Far-field sub diffraction optical microscopy using metamaterial crystals: Theory and simulations", *Physical Review B*, August 2006, 74, pp. 075103; A. Grbic and G. V. Eleftheriades, "Overcoming the diffraction limit with a planar left-handed transmission-line lens," *Phys. Rev. Lett.*, vol. 92, no. 11, pp. 117403, Mar. 19, 2004; P. Alitalo, S. Maslovski and S. Tretyakov, "Experimental verification of the key properties of a three-dimensional isotropic transmission-line superlens," *JAP*, vol. 99, p. 124910, 2006]. In particular, near-field sub-wavelength focusing has been demonstrated by artificially synthesized metamaterial lenses, which come close to operating according to the 'perfect lens' concept developed by J. B. Pendry [J. B. Pendry, "'Negative refraction makes a perfect lens", *Phys. Rev. Lett.*, April 2000, 85, (18) pp. 3966-3969]. Such near-field focusing structures hold promise for improving microscopy, lithography, near-field sensing, imaging, and other applications. However, all these efforts are hindered by material losses which severely limit the achieved sub-wavelength resolution levels.

Some researchers propose near-field focusing using an assumed aperture current distribution obtained by manipulating the corresponding plane-wave spectrum [R. Merlin, "Radiationless electromagnetic interference: evanescent-field lenses and perfect focusing", *Science*, July 2007] and a physical realization has recently been reported [A. Grbic, L, Jiang, R. Merlin, "Near-Field Plates: Subdiffraction Focusing with Patterned Surfaces," Science, vol. 320, no. 5874, pp. 511-513, Apr. 25, 2008]. While these structures appear to hold promise for a variety of applications including microwave imaging, near-field sensing, lithography, and microscopy, they remain of limited practical use because they cannot be scaled to any arbitrary frequency and the demonstrated focusing is confined in a parallel-plate environment (and not free space). Moreover the demonstrated focusing is limited to one dimension (azimuth only).

Near-field imaging systems capable of producing sub-wavelength resolution have also attracted much interest in the photonics community. Their ability to focus the evanescent components of an illuminated object breaks the conventional barrier of the "diffraction limit", and leads to the formation of concentrated sub-wavelength light spots on the order of nanometers. Such structures can find applications that range from bio-imaging and sensing to photolithography.

SUMMARY OF THE INVENTION

The present invention applies concepts of holography to the near-field, to provide sub-wavelength focusing based on a holographic metallic screen [G. V. Eleftheriades, "Negative-Refractive-Index Transmission-Line (NRI-TL) Metamaterials", *Intl. Symposium on Electromagnetic Theory URSI-Commission B*, Ottawa, Jul. 26-28, 2007; A. M. H. Wong, C. D. Sarris and G. V. Eleftheriades, "Metallic transmission screen for sub-wavelength focusing," IEE Electronics Letters, vol. 43, no. 25, pp. 1402-1404, December 2007. The screen comprises an array of closely spaced slot antennas and exploits resonance to boost the field magnitude of the sub-wavelength focus. The present invention takes into account both propagating and evanescent waves, as well as arbitrary incident waves. Whereas prior art approaches propose generic screen current distributions, the present invention provides readily realizable holographic screen patterns using simple resonant slots of unequal length cut on a ground plane.

There is provided a device for focusing an incident electromagnetic plane wave having a frequency of between $10^3$ and $10^{15}$ Hertz, the device comprising a ground plane having a plurality of parallel slots cut therein selectively positioned to focus the plane wave in the near field focal plane into spots which have a maximum diameter less than the wavelength of the plane wave.

The ground plane may be a metallic screen. The plurality of slots may be three slots, which may be of differing lengths. There may be a central slot and a pair of lateral slots, one on either side of the central slot, each slot having a length of between $0.95\lambda$ and $1.05\lambda$. The arrangement of slots may be selected such that inductive and capacitive slots are adjacent one another.

There is also provided a method of focusing electromagnetic waves into spots in the near-field plane, comprising directing an incident electromagnetic plane wave towards a ground plane, the ground plane having a plurality of parallel slots cut therein. The frequency of the electromagnetic waves may be between $10^3$ and $10^{15}$ Hertz, and variation of the amount of loss at the screen does not alter the diameter of each spot. The method may comprise focusing is in two dimensions, azimuth and elevation.

There is provided a method for fabrication of a metallic transmission screen comprising the steps of 1) selecting a plate of stainless steel having of a desired thickness; 2) laser cutting a plurality of slots into the plate; and 3) stretching the plate on a frame.

The device and method for increasing the field strength at the image plane in an electromagnetic wave focusing system of the present invention may be used for microwave imaging, lithography, sensing, microscopy, and detection, among other possible applications. The device may be used for focusing an incident electromagnetic plane wave in two dimensions, both azimuth and elevation.

There is further provided a device for focusing in two dimensions an incident electromagnetic plane wave having a frequency of between $10^3$ and $10^{15}$ Hertz, the device comprising a ground plane having a plurality of parallel slots cut therein selectively positioned to focus the plane wave in the near field focal plane into spots which have a maximum diameter less than the wavelength of the plane wave.

BRIEF DESCRIPTION OF THE DRAWINGS OF THE INVENTION

The invention may be best understood with reference to the following detailed description and the drawings, in which.

DETAILED DESCRIPTION OF THE INVENTION

Figure 1:
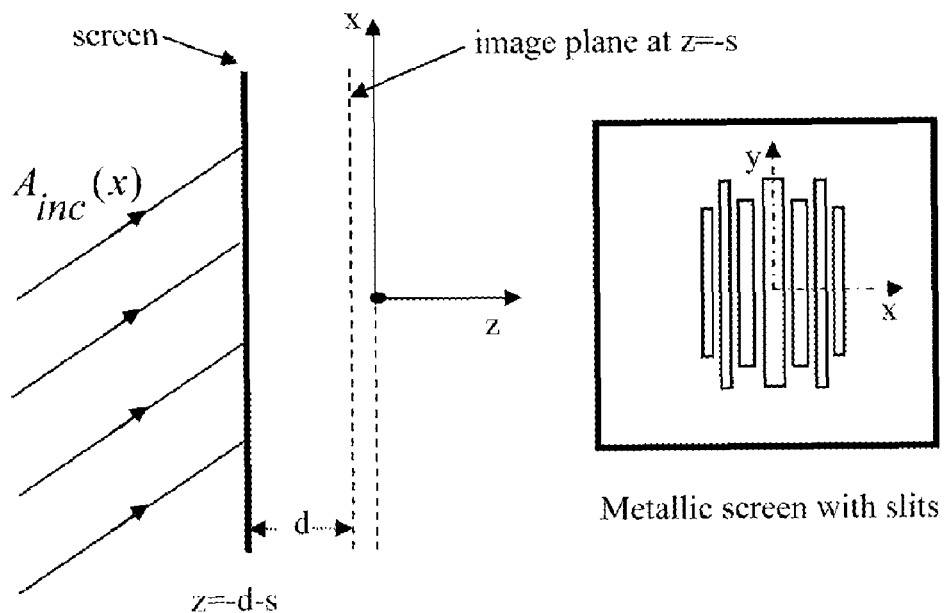
FIG. 1 depicts a near-field focusing set up with a resonance metallic screen.

According to a preferred embodiment of the present invention, as depicted in FIG. 1, there is provided a metallic transmission screen that will allow an incident plane wave $A_{inc}$(x) on a first side of the screen to form a sub-wavelength focus on an opposed second side of the screen. For this purpose, a suitable "source" distribution at the image plane is determined a distance "d" from the screen. A sub-wavelength distribution will contain ample evanescent-wave (near-field) components.

According to one embodiment, source distributions may be of the form exp(−jkr)/$r^n$, where n is an integer. Such source distributions are singular at r=0 and cannot be reconstructed at the singularity point. Nevertheless, such a distribution potentially can be reconstructed at a nearby auxiliary plane, a distance "s" from r=0. The following source distribution may be reconstructed:

$$E_{source}(x,z=-s)=\exp(jkr)/r, r=\sqrt{x^2+s^2} \quad (1)$$

2-D (∂/∂y=0) and scalar propagation are assumed; and only a 1/r field variation is used.

Higher powers (n>1) will result in richer evanescent-wave spectrums. However, with the parameters indicated, the angular spectrum at the image plane may be analytically calculated as:

$$S(k_x, z=-s) = \int_{-\infty}^{+\infty} E_{source}(x)\exp(-jk_xx)\,dx = K_o(jsk_z) \quad (2)$$

where $k_z=-j\sqrt{k_x^2-k^2}$ and $K_o$ is the modified Bessel function of the second kind.

From Equation (2) it is evident that for s≪λ there is a finite evanescent-wave spectrum which approaches $K_o(k_xs)$ for $k_x$≫k and hence remains bounded.

The next step in the formulation is to determine the field distribution at the screen which corresponds to the image field of Equation (1). For this purpose, the corresponding spectrum of Equation (2) is back-propagated to the screen plane by multiplying it by the factor exp(+j$k_z$d). For the propagating components, this process leads to a phase reversal exp(j|$k_z$| (d+s)), whereas for the evanescent components this process leads to a growth which can be written, for $k_x$≫k, as:

$$S(k_x,z=-s-d)=K_o(|k_x|s)\exp(|k_x|(d+s)) \quad (3)$$

Equation (3) represents the evanescent-wave spectrum which is established at the screen plane to reconstruct the sub-wavelength focused beam of Equation (1) at the image plane. This spectrum is very rich in evanescent-wave components and although the Bessel term asymptotically attenuates as exp(−$k_x$s), there is an overall total growth of exp($k_x$d) which becomes unbounded as $k_x$→∞. Accordingly, the original source spectrum is made band-limited so that the spectrum at the screen remains finite. Therefore, equations (2) and (3) may be considered to vanish outside the range |$k_x$|≤$k_m$, where $k_m$ is the maximum transverse wavenumber to be reconstructed.

Consequently, $k_m$ would ultimately determine the achieved sub-wavelength beamwidth (resolution) at the image plane. Since the overall spectrum is dominated by the large, exponentially growing evanescent components, the screen spectrum may be approximated by its asymptotic form as:

$$S(k_x, z=-s-d) \approx \exp(|k_x|d) \text{ for } k_o < |k_x| \leq k_m \quad (4)$$

The spatial distribution to be established at the screen plane may be determined by performing an inverse Fourier transform of Equation (4) in its band-limited version. Assuming $k_m \gg k_o$, the following approximate expression for a field component that leads to sub-wavelength focusing may be expressed as:

$$S_{apr}(x, z=-s-d) = e^{k_m d} \frac{\cos(k_m x)}{d^2 + x^2} \quad (5)$$

The corresponding field distribution at the image plane is calculated, beginning with calculation of the spectrum of Equation (5), which is:

$$S_{apr}(k_x, z=-s-d) = e^{k_m d} \frac{\pi}{2d} [e^{-d|k_x - k_m|} + e^{-d|k_x + k_m|}] \quad (6)$$

Using Equation (6), the field at the image-plane is expressed as:

$$S_{apr}^{img}(x) = \int_{-\infty}^{+\infty} S_{apr}(k_x, z=-s-d) e^{-jk_z d} e^{-jk_x x} dk_x \quad (7)$$

Equation (7) may be approximated by:

$$S_{apr}^{img}(x) \cong \frac{\pi}{2d} \left[ \frac{2d}{x^2 + 4d^2} + \frac{\sin(k_m x)}{x} \right] \quad (8)$$

Figure 2:
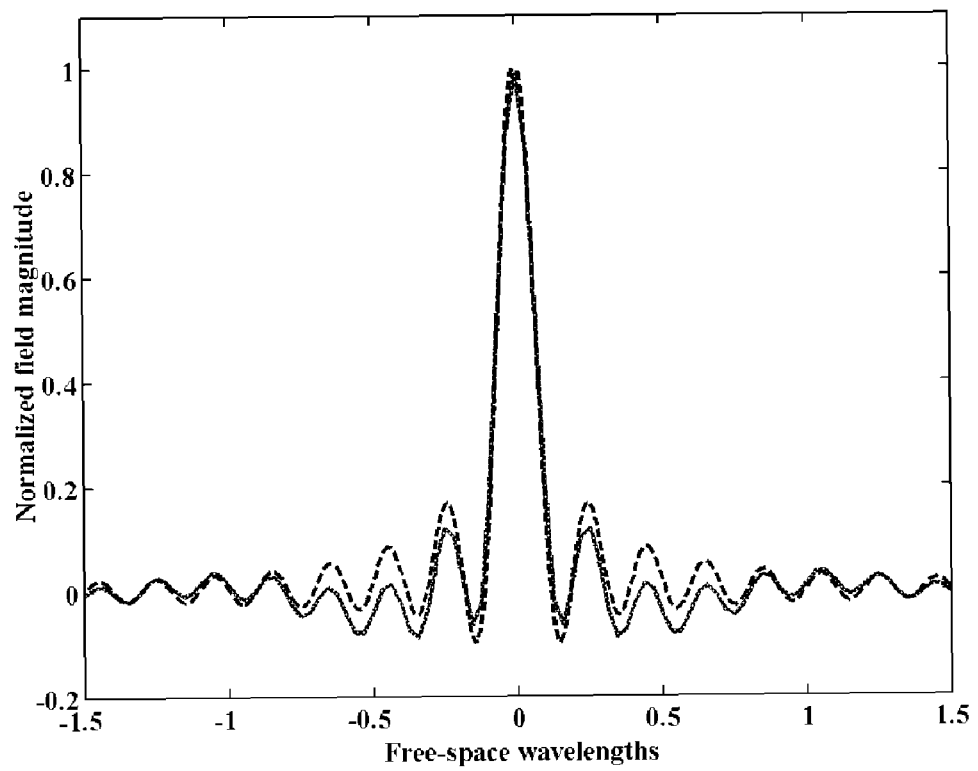
FIG. 2 shows a field at image plane, wherein the solid line represents exact integration and the dashed line approximate expression.

The dominant term in Equation (8) is the second one which is a sub-wavelength sinc distribution of null-null beamwidth $2\pi/k_m$. The first term is merely a weak background distribution. A comparison of Equations (5) and (8) reveals, as would be expected, that there is an exponential field attenuation $\exp(-k_m d)$ from the screen to the image plane. FIG. 2, which depicts a comparison of the exact integration of Equation (7) to the approximate closed-form expression of Equation (8), demonstrates a high degree of agreement.

A transmission screen may be synthesized to produce a given screen field distribution $S(x)$ upon illumination by a plane wave $A_{inc}(x)$, as shown in FIG. 1. Using holographic principles, a transmission function may be chosen that is proportional to the intensity of the interference pattern between $S(x)$ and the incident field at the screen $A_{inc}(x)$. The corresponding transmission function will then be:

$$T(x) \propto |S(x)|^2 + |A_{inc}(x)|^2 + S_{ap}(x) A_{inc}(x) + S_{ap}(x) A^*_{inc}(x) \quad (9)$$

A desirable characteristic of this holographic screen is that the incident wave may be arbitrary, provided $|A_{inc}|$ is constant, such as a general oblique plane-wave or a far-field spherical wave. Moreover, $T(x)$ is positive and real which facilitates its realization using slots cut on a ground plane. However, as always in holography, extraneous modes are produced which may obliterate the image if not properly filtered out [J. W. Goodman, "Introduction to Fourier Optics", (Roberts & Company, Englewood, Colo., 2005)]. To this end, the target screen distribution of Equation (5) is already real but assumes both positive and negative values. Therefore, Equation (5) may be synthesized directly upon a normally incident plane wave illumination, thus avoiding potential complications with holographic extraneous images, and slots cut on a metallic sheet may be used.

A physical realization of Equation (5) may be achieved using an array of slots cut on a ground plane. Assuming that f=3 GHz and thus $\lambda$=10 cm in free space, a practical goal for a sample structure would be to allow evanescent-wave components up to $k_m = 5k = 2\pi/\lambda_m$, thus achieving a null-null-beamwidth of $\lambda/5$ at a distance $d=\lambda/10$ from the transmission screen.

With these assumptions, the field component of Equation (5) may be synthesized using two slots per $\lambda_m$ wavelength, to satisfy the sampling theorem. These slots may be placed at the discrete locations described by $x_n = \pm n \lambda_m / 2 = \pm nd$ where n=0, 1, 2, 3 .... From Equation (5), therefore, the required normalized field strengths at each slot would be $S_n = (-1)^n/(1+n^2)$ = 1, -1/2, +1/5, -1/10 ....

Figure 3:
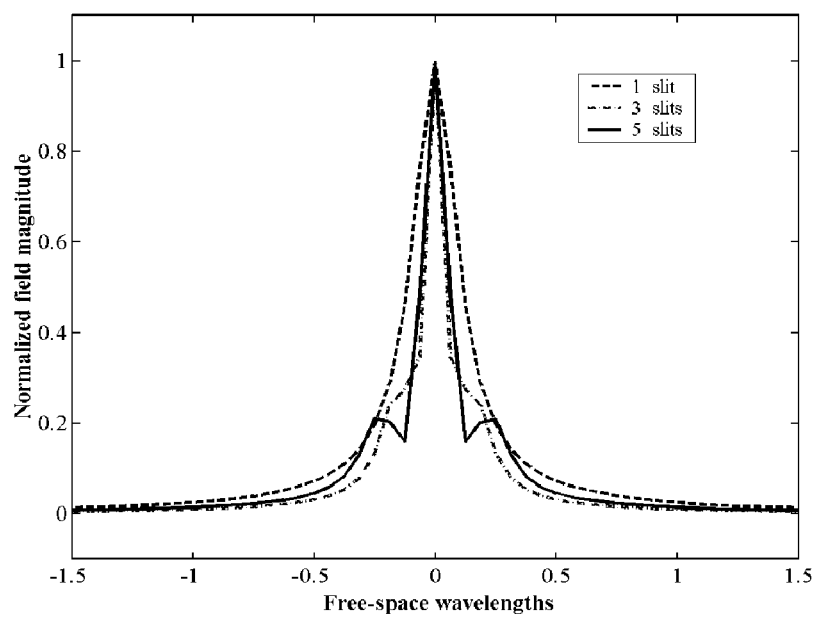
FIG. 3 shows a field distribution at image plane $d=\lambda/10$ for various numbers of slots of width=$S_n * \lambda_m/4$.

FIG. 3 shows the focused field distribution at the image plane for one, three and five slots, assuming uniformly illuminated slots and an exact plane-wave expansion integration. With five slots, a null-null beamwidth of $\lambda/5$ and a full 3 dB beamwidth of $0.6 * \lambda/5$ are achieved, as predicted by Equation (8). FIG. 3 indicates that even with only three slots, a $\lambda/5$ resolution is obtainable.

To physically synthesize such a transmission screen, slots close to resonance may be used to realize both positive and negative field amplitudes. As slots shorter than $\lambda/2$ are inductive, and slots longer than $\lambda/2$ are capacitive, the required $\pi$ phase shift may be created by using adjacent inductive and capacitive slots. Furthermore, the slot-field amplitude may be controlled by changing the length and width of the slots. Using this approach, a three-slot screen with Ansoft's HFSS is designed. The central slot may have dimensions of 53 mm×4 mm and the dimensions of the two adjacent slots may be 40 mm×2.5 mm. By optimizing the slot widths, a $\lambda/5$ null null beamwidth is achieved close to the ideal case of FIG. 2.

Figure 4:
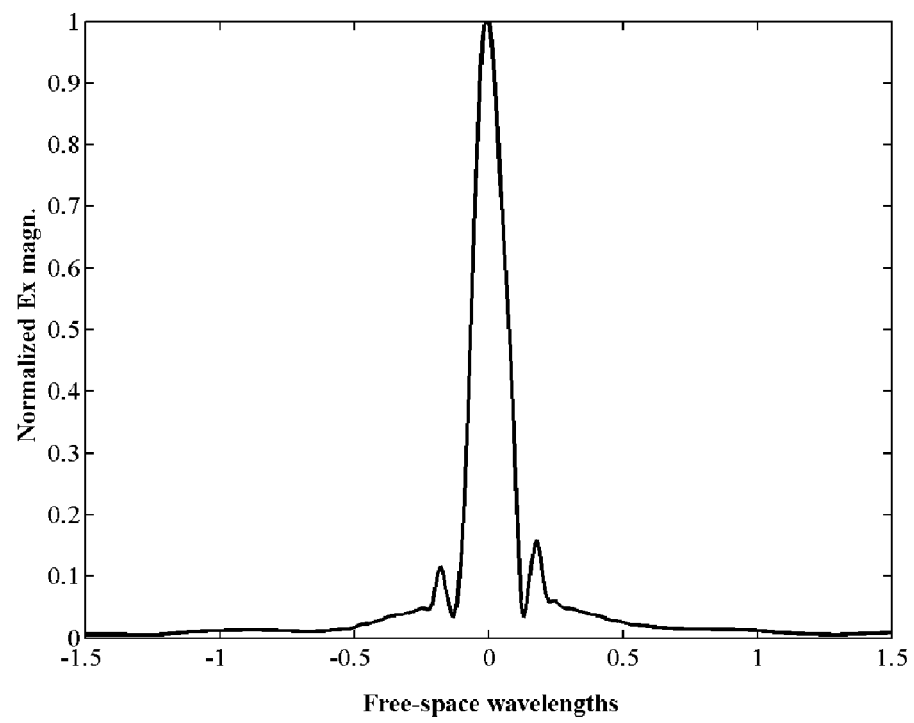
FIG. 4 depicts a full-wave HFSS simulation of a 3-slot screen at 3 GHz.

The result for a normally incident plane-wave is shown in FIG. 4, where a clear $\lambda/5$ null-null beamwidth is achieved, in contrast to the much wider beamwidth from a single slot, also at $d=\lambda/10$, as seen in FIG. 3. Although there is a field attenuation of $\exp(-k_m d)$ from screen to image plane, nevertheless the field strengths of the incident and focused fields are comparable because the slots are almost resonant and hence the local slot field is enhanced compared to the incident field strength. Moreover, unlike the 'perfect lens', the beamwidth is not directly related to losses. The focused field magnitude is affected, but the resolution is not. If 2-D beams are desired, three concentric slots with a central off-resonant capacitive slot may be used, with loading inductively of the interior and exterior slots using, for example, simple printed pads.

At microwave frequencies, upon illumination of plane waves, a metallic screen containing several slots produces a transmission function that leads to the formation of a sub-wavelength point source in the near field. The loss independence and high transmitted peak intensity make the sub-wavelength focusing screen of the present invention an attractive option for practical sub-wavelength focusing in the near-field.

According to another embodiment of the present invention, the reference wave used may be a normally incident plane wave described by $E_{ref}(x, z) = \exp(-ik_0 z)$, to reconstruct a converging wave described by $$E_{con}(x,z) = \exp(ikr)/r \text{ where } r = \sqrt{x^2 + (z-d)^2} \quad (10)$$

where d represents the focal distance. In operation, the transmission function will be multiplied with the reference waveform to form a new waveform $E_{rec}$ immediately to the right of the interference plane, which will reconstruct $E_{con}$ at the image plane. While the choice of the field distribution at the image plane is in general arbitrary, we have been motivated to reconstruct $E_{con}$ in the form of Equation (10) because earlier work on a negative-refractive-index slab lens has revealed similar field variation close to and to the right of the image plane (i.e. away from the lens). Furthermore, the near-field spectrum of Equation (10) has ample evanescent-wave components, thus allowing image formation with sub-wavelength resolution (other suitable evanescent-wave 'rich' distributions would include $\exp(jkr)/r^2$, etc.).

An approach to designing a general transmission function T(x) is outlined which converts an arbitrary electric field $E_{ref}$ into a chosen $E_{con}$ at the image plane. Although for simplicity 2-D propagation (i.e. $\partial/\partial y=0$ in FIG. 5) is assumed, the following procedure can be extended to a 3-D scenario. Through the principle of back-propagation, a determination of the desired waveform $E_{rec}$ at the interference plane which will lead to the waveform $E_{con}$ at the image plane is possible.

First, the desired converging wave of Equation (10) is expanded as a spectrum of propagating and evanescent plane waves along an auxiliary plane, a short distance s to the right of the image plane (see FIG. 5):

$$S(k, z = d + s) = \int_{-\infty}^{+\infty} E_{con}(x, z = d + s)\exp(-ik_x x)dx \quad (11)$$

$$= k_o\left(is\sqrt{k_o^2 - k_x^2}\right)$$

where $k_o$ is the zero order modified Bessel function of the second kind. Note that the image plane (z=d) was avoided due to the singularity caused by the implied presence of a source by Equation (10), which cannot be physically reproduced by the superposition of plane waves. Moreover, all evanescent waves decay in the +z direction, hence evanescent components are enhanced as they are back-propagated from the auxiliary plane to the interference plane; this enhancement of evanescent components is crucial to obtaining sub-wavelength focusing capability.

The spectrum at the interference plane may be expressed as $$S(k_x, z=0) = K_o(isk_z)\exp(-ik_z(s+d)) \text{ where } k_z = \sqrt{k_o^2 - k_x^2} \quad (12)$$

Finally, an inverse Fourier transform is performed to obtain $E_{rec}$. After obtaining $E_{rec}$, the required transmission function of the screen can be calculated by $T(x) = E_{rec}(x)/E_{ref}(x, z=0) = E_{rec}(x)$. ($E_{ref}=1$ for a normally incident plane wave.)

Figure 6:
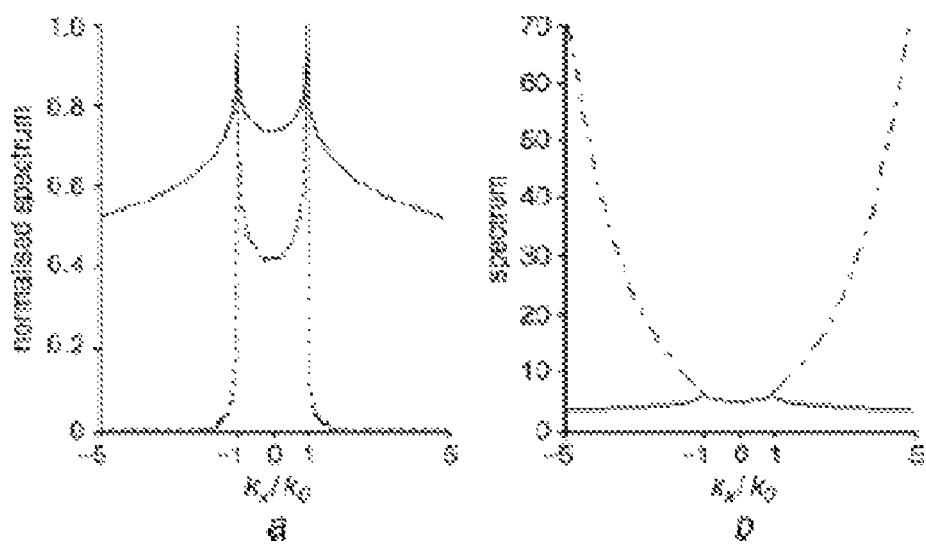
FIG. 6 depicts (a) comparison of normalized spectrum at auxiliary plane s=0.001λ (solid) and plane 0.5λ to right of image plane (dot), showing $E_{con}$(x, y)=exp(ikr)/r contains significant evanescent components in the near field, and (b) comparison of spectra at auxiliary plane (solid) and interference plane (dash-dot)

This procedure is followed to design a transmission function which converts a normally incident plane wave into a waveform focusing at a distance of $d=\lambda/10$. To handle the diverging nature of the spectrum of Equation (12), it is truncated to a bandwidth of $[-5k_0, 5k_0]$. This implies that the actual spectrum of Equation (11) to be reconstructed is truncated to a maximum wavenumber $|k_{xm}|=5k_0$. Since this bandwidth is five times the bandwidth of conventional imaging systems, which transmit only propagating waves, the optimal focusing quality of the resulting screen is expected to be about $\lambda/10$, a fivefold improvement over the diffraction limit. FIG. 6 shows the spectra at the auxiliary plane (solid) and the interference plane (dash-dot). A growth in the evanescent components can be clearly observed at the interference plane.

Figure 7:
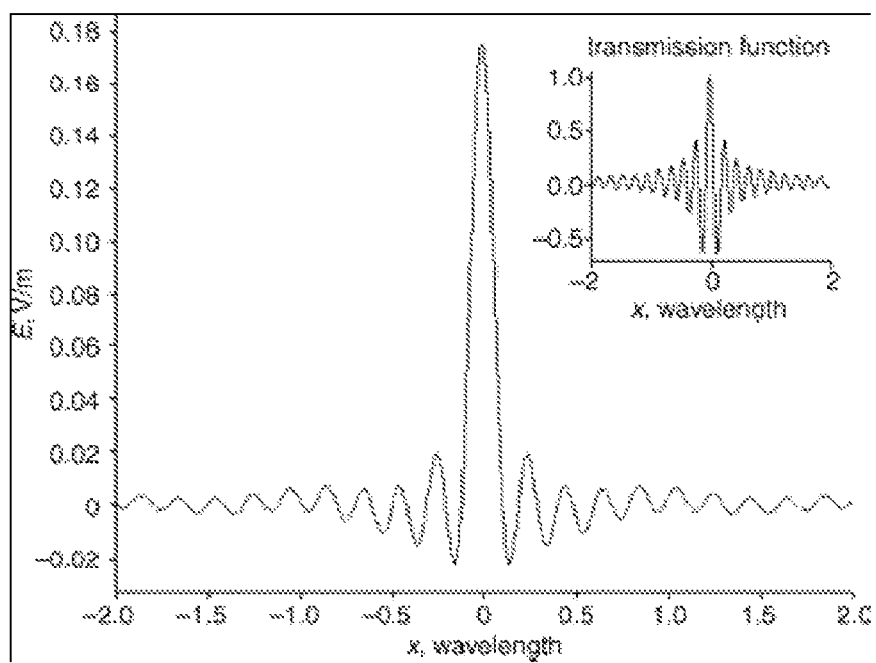
FIG. 7 shows real part of field distribution at image plane, after applying transmission function to reference wave $E_{ref}$, with field amplitude 1 V/m—with design transmission function depicted in inset.

The inset of FIG. 7 shows the real part of the designed transmission function. This function has a (sub-wavelength) periodicity which matches that of the bandwidth limit ($k_{xm}$); this is essential for encoding the sub-wavelength information onto the screen. FIG. 7 shows the corresponding field distribution along the image plane of which the full width at half maximum (FWHM) is $0.13\lambda$. This is approximately a 5-fold improvement over the FWHM of $0.6\lambda$ for a diffraction-limited sinc(x) function. Higher resolution can be obtained by simply using a wider bandwidth $|k_{xm}|$, thus resulting in a correspondingly narrower focal width. However, this is associated with an attenuation in magnitude from the screen to the image plane of the order of $\exp(-k_{xm}d)$.

According to yet another embodiment of the present invention, for use with optical frequencies of electromagnetic waves, there is provided a transmission screen inspired by the principle of near-field holography to produce sub-wavelength focusing at optical frequencies.

Holography is a "wavefront construction" technique to capture the intensity as well as the phase information of a wave scattered from an object [S. Ramo, J. R. Whinnery, and T. van Duzer, *Fields and Waves in Communication Electronics*, John Wiley and Sons, Inc., New York, 1994]. This technique is based on interfering the scattered wave with a reference wave of the same frequency. It leads to the construction of a hologram, which is a screen of certain transmission pattern that can yield a virtual and a real image of the object under illumination by a reference plane wave. Applying holography in the near field can reproduce both the propagating and evanescent components of the image, which results in a sub-wavelength resolution. In our case, the field distribution pattern at the image plane is chosen to be a point source, which has the form of $$E_{con}(y,x)b = \exp(ikr)/r \text{ where } r = \sqrt{y^2 + (x-d)^2} \quad (13)$$

Figure 8:
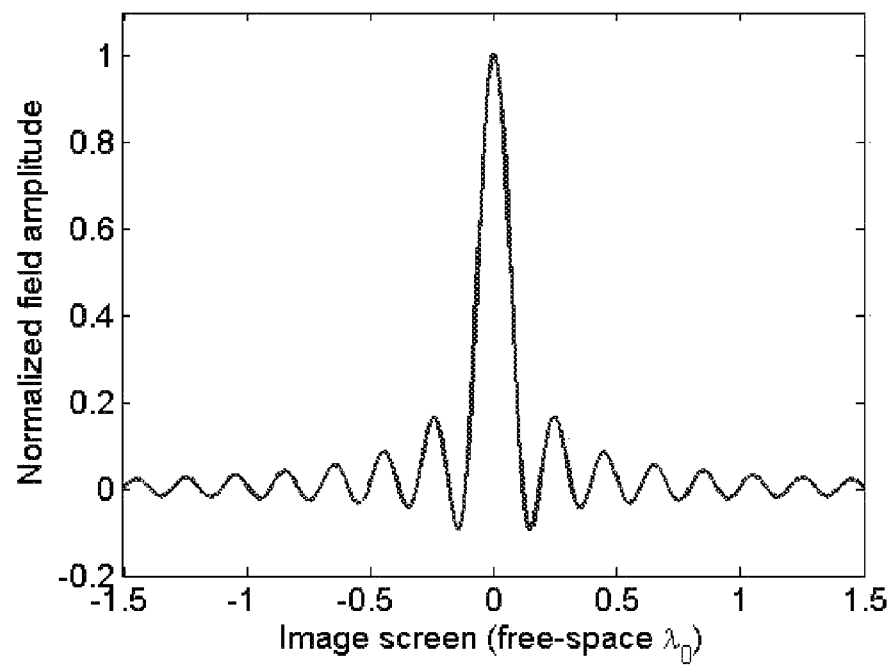
FIG. 8 shows a field pattern at the image plane.

It contains rich evanescent waves in the near field, therefore allowing a relatively clear image with sub-wavelength resolution. The derivation of the transmission function is done through the backward propagation analysis of the spectrum at an auxiliary plane close to the image plane. The spectrum analysis is done on the auxiliary plane instead of the image plane in order to avoid the singularity of the desired image pattern in Equation (13). Both propagating and evanescent components are present at the auxiliary plane, and the spectrum has the form of $$S(k, x = d + s) = \int_{-\infty}^{+\infty} E_{con}(y, x = d + s)\exp(-ik_y y)dy \quad (14)$$

$$= K_o\left(is\sqrt{k_o^2 - k_y^2}\right)$$

where $K_0$ is the zero order modified Bessel function of the second kind. This leads to a field pattern illustrated in FIG. 8 at the image plane. Through amplification of evanescent waves during the back-propagation process, we obtain the spectrum at the screen to be:

$$S(k_y, x=0) = K_o(isk_x)\exp(-ik_x(s+d)) \text{ where } k_x = \sqrt{k_o^2 - k_y^2} \quad (15)$$

Note that this spectrum is truncated within the bandwidth limit of $5k_0$ in order to preserve enough evanescent waves in Equation (15) while avoiding its diverging nature. The resolution of the image is then limited by this truncation. Finally, the field distribution is obtained by performing an inverse Fourier transform analysis to reveal the holographic pattern on the screen as illustrated in FIG. 9.

Figure 9:
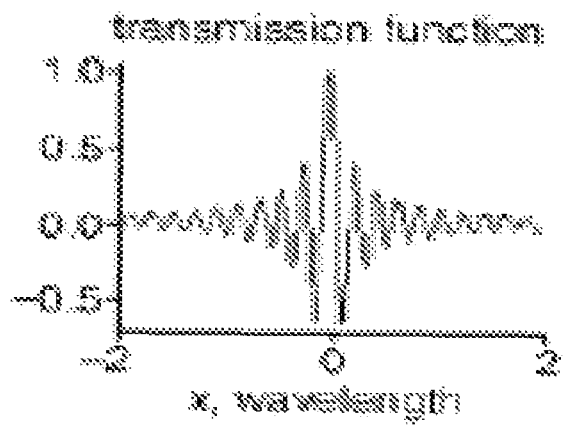
FIG. 9 shows a field pattern at the screen.
Figure 10:
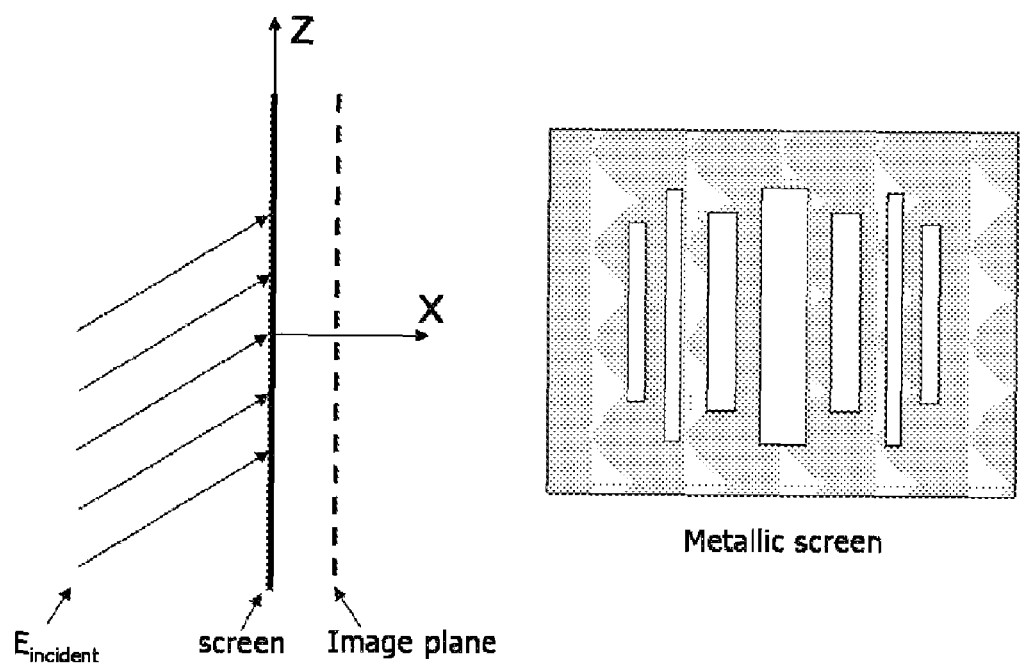
FIG. 10 depicts a slots pattern on metal screen that approximates the transmission field distribution.

Finally, the field pattern in FIG. 9 is approximated by placing slots $\lambda/10$ away from each other, as illustrated in FIG. 10 in order to satisfy the sampling theorem. The slots act as slot antennas, whose size is varied to produce field strength in accordance with the transmission pattern. The amplitude distribution of the slots is symmetric along the middle slot with the following pattern, $$S=1,-1/2,1/5,-1/10, \quad (16)$$

The present invention provides a metal screen consisting of three nanoscaled slots, which act as plasmonic antennas that approximate the transmission pattern of the hologram. Compared to near-field imaging systems implemented at microwave frequencies, the plasmonic slots exhibit much shorter physical lengths. Furthermore, the surface plasmon modes excited along the transmission screen also affect the image resolution observed through three-dimensional fullwave simulations. This proposed simple 'metascreen' structure can lead to easy fabrication at optical frequencies.

The electrical length of resonant slot antennas is significantly smaller compared to their microwave counterparts due to the short wavelength of the surface plasmon mode excited along the antenna arms [E. Cubukcu, E. A. Kort, K. B. Crozier, and F. Capasso, "Plasmonic Laser Antenna," *Applied Physics Letters*, Volume 89, 2006, pp. 09120; L. Novotny, "Effective Wavelength Scaling for Optical Antennas," *Physical Review Letters*, Volume 98, 2007, pp. 266802]. Another characteristic is due to the excitation of surface plasmon modes on the metallic plate, which results in a tangential electric field component along the transmission screen. This tangential component also contributes to the field pattern seen at the image plane. Additionally, the scattered electric field from the plasmonic screen contains a stronger longitudinal component, which does not contribute to the sub-wavelength focusing.

Three-dimensional fullwave simulations are conducted using Ansoft's High-Frequency-Structure Simulator (HFSS) for a screen consisting of three slots at 830 nm with the geometry listed in Table 1.

TABLE 1

Comparison of the sizes of slots on PEC screen and plasmonic screen

|  | PEC screen | Plasmonic screen |
|---|---|---|
| Middle slot | 33.2 × 439.9 nm | 20.75 × 300 nm |
| Side slots | 20.75 × 332 nm | 20.75 × 100 nm |

Figure 11:
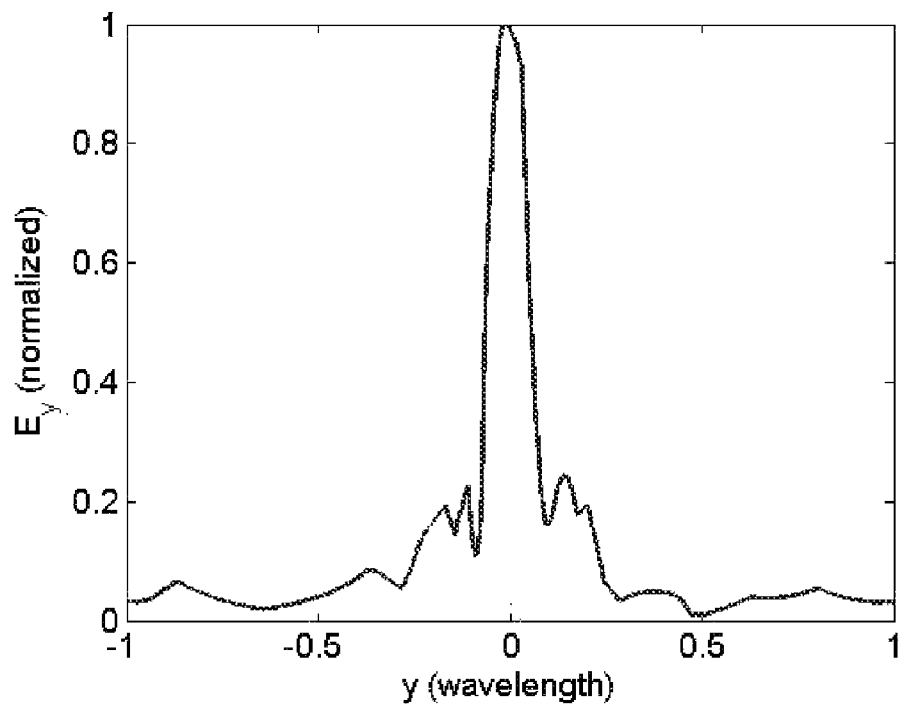
FIG. 11 shows sub-wavelength focusing at the image plane due to a 3-slot hologram for a perfect electric conductor ("PEC") screen.
Figure 12:
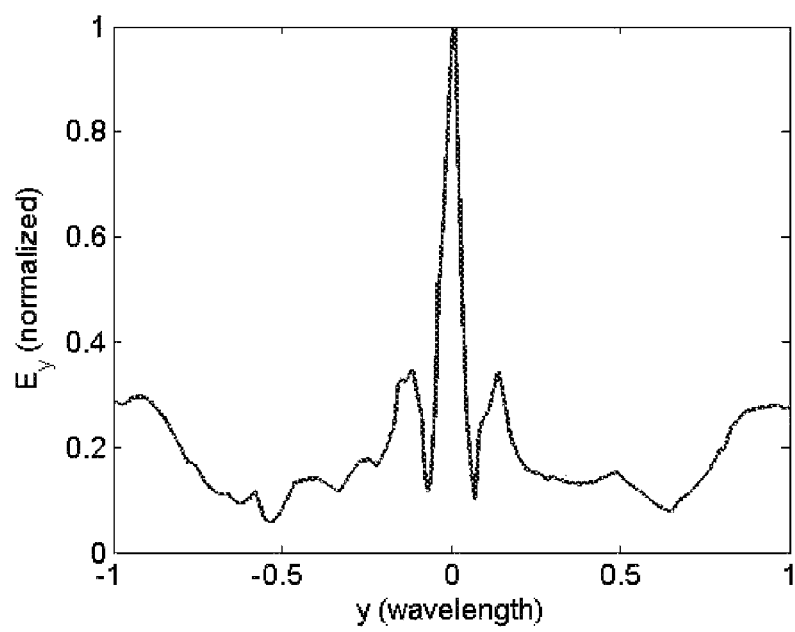
FIG. 12 shows sub-wavelength focusing at the image plane due to a 3-slot hologram for a plasmonic screen at optical frequencies.

The focusing illustrated in FIGS. 11 and 12 shows that the resolution of the image has a null-null bandwidth of $\lambda_0/5$, which corresponds to a 5-fold improvement from the diffraction limit. This improvement of resolution is determined by the truncation of the spectrum at the screen to be within a bandwidth of $5k_0$.

Fabrication of the device is relatively simple. The focusing screen may comprise closely spaced, unequal size slots cut on a metallic sheet. The size of the focused spots is insensitive to losses on the screen. The slot lengths are close to $\lambda$, regardless of the frequency of operation. The width of the slots may be modulated to achieve the desired sub-wavelength focusing effect. The spacing between slots determines the desired resolution. For example $\lambda/10$ spacing between slots will result in a null-to-null beamwidth of $\lambda/5$.

The present invention provides a practical realization of sub-wavelength focusing of electromagnetic radiation, scalable from microwave frequencies (10 GHz), through Terahertz frequencies, to optical frequencies. Practical applications include microwave imaging, near-field sensing, detection, photolithography and microscopy.

In one embodiment of the present invention, fields emanating from sources located behind the metallic screen, in addition to plane waves, may be focused. One application of such an embodiment would be point-to-point focusing.

The present invention will be further understood by reference to the following non-limiting examples:

EXAMPLES

Example 1

Non-Resonance Metallic Screen

Using a metallic screen, a close approximation to transmission function was implemented, following a technique inspired by earlier work on far-field microwave holographic antennas. In holography, the transmission function is the intensity of the interference pattern of the object and reference waveforms:

$$T_{approx}(x)=\|E_{ref}(x,z=0)+E_{rec}(x)\|^2$$

$$T\text{approx}(x)=1+2Re\{E_{rec}(x)\}+\|E_{rec}(x)\|^2 \quad (17)$$

Upon reconstruction, one retrieves the image and the conjugate image $E_{rec}$ and two other terms contributing to zero-order transmission. Since these zero-order transmission terms only contribute to background noise, we suppress them to obtain $T'_{approx}(x)=Re\{E_{rec}(x)\}$. To realize this function with metallic strips and slots, we place metal strips to represent the transmission function's periodicity and fringe width. However, while prior art pads positive (high intensity) fringes with metallic strips, we pad the negative cycles of $T'_{approx}(x)$ with metallic strips. We also slightly alter the sizes of metallic strips such that the field amplitudes transmitted by the sidelobes are in proportional agreement with those described in $T'_{approx}(x)$.

TABLE 2

Figure 5:
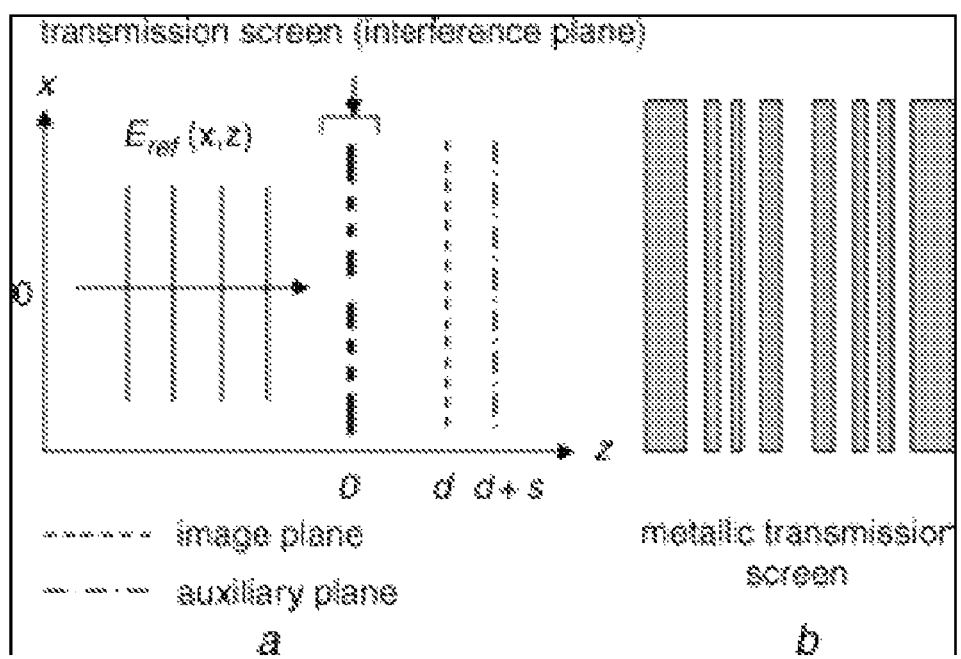
FIG. 5 depicts (a) setup of a non-resonance transmission screen and (b) a non-resonance metallic transmission screen designed for focusing a 3 GHz incident plane wave to a sub-wavelength spot at the image plane.

Locations and sizes of slots on metallic screen (see FIG. 5)

| Centre | Width |
|---|---|
| 0λ/0 mm | 0.144λ/14.4 mm |
| ±0.241λ/±24.1 mm | 0.062λ/6.2 mm |
| ±0.450λ/±45.0 mm | 0.062λ/6.2 mm |
| ±0.658λ/±65.8 mm | 0.075λ/7.5 mm |

Figure 13:
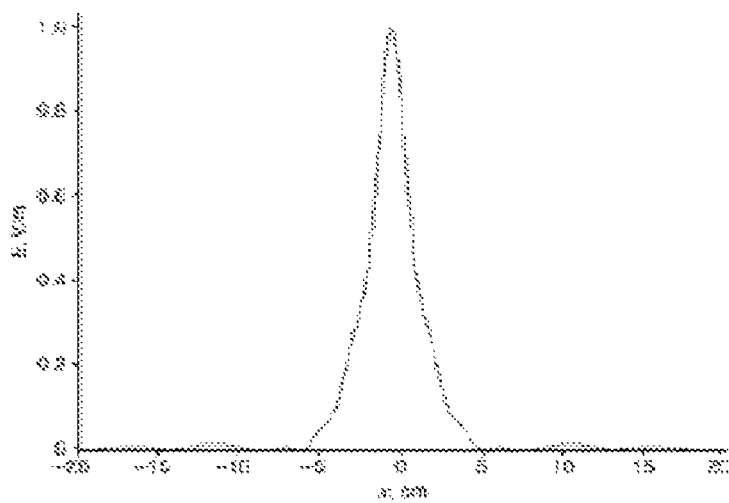
FIG. 13 depicts full-wave field distribution at image plane (normalized), after shining normally incident 3 GHz plane wave $E_{ref}$ onto metallic screen.

FIG. 5 shows a diagram of the transmission screen, and Table 2 summarizes the locations and widths of the slots on the metallic screen. Full-wave simulations with COMSOL at 3 GHz show a FWHM of 0.25λ at a distance 0.1λ away from the metallic screen. The corresponding magnitude of the electric field at this image plane is shown in FIG. 13. As shown, the focusing quality of the metallic screen does not fully match that of the complex screen. It can be shown that this mismatch can be mainly attributed to the inability of a binary screen to produce both positive and negative field values (see inset of FIG. 7). This produces a non-zero 'DC' distribution around $k_x=0$ which superimposes on the desired distribution at the image plane of FIG. 7 and produces the observed beam widening in FIG. 13 near the null-points. Nevertheless, the obtained FWHM of 0.25λ still represents a dramatic improvement over the diffraction-limited FWHM of 0.6λ.

Example 2

Resonance Metallic Screen

Figure 14:
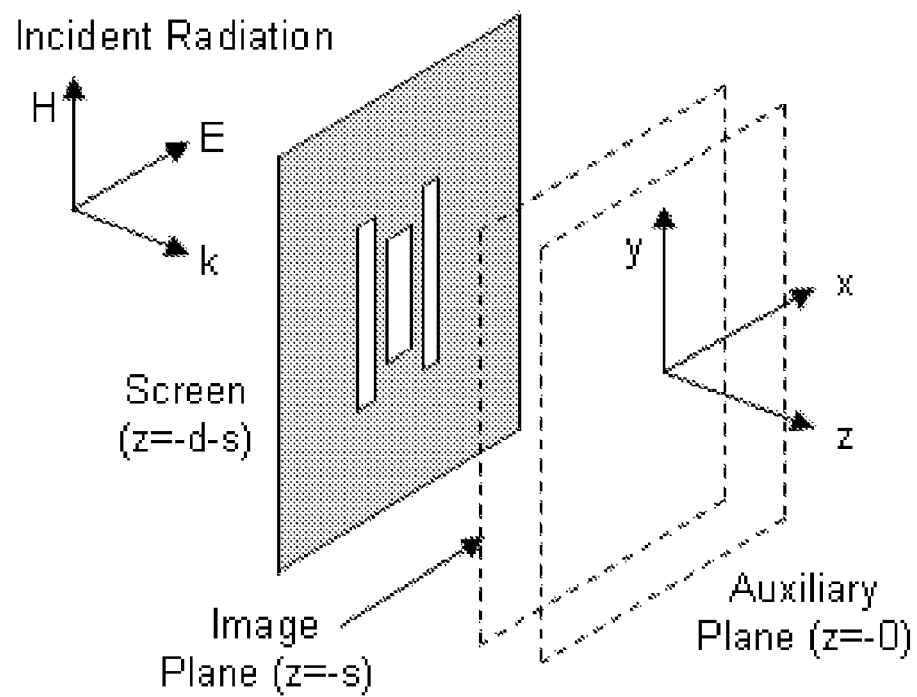
FIG. 14 depicts a schematic diagram of the metallic sub-wavelength focusing screen.

FIG. 14 shows the geometry of the formulation of a preferred embodiment of the present invention. Initially, a field distribution at the screen is sought E(x,z=−s−d), which would generate a highly focused 2-D field distribution:

$$E(x,z=-s)=\exp(-ikr)/r \quad (18)$$

where $r=\sqrt{x^2+s^2}$ at the image plane $z=-s$. Back-propagating the electric field via a spectral decomposition method yields the corresponding spectrum at the plane of the screen:

$$S(k_x,z=-s-d)=K_0(|k_x|s)\exp(|k_x|(d+s)) \quad (19)$$

where $K_o$ is the $0^{th}$-order modified Bessel function of the 2nd kind.

The spectrum of Equation (19) is dominated by high spatial frequency components. Furthermore, it is not physically realizable, because $\exp(|k_x|(d+s))$ becomes unbounded as $|k_x| \to \infty$. Hence, a band-limited spectrum $S'(k_x)$ is considered, which equals $S(k_x,z=-s-d)$ for a limited spectral band $|k_x| \leq |k_m|$ but vanishes outside this band. A high spatial frequency asymptotic approximation to $S'(k_x)$ is then applied to analytically express the field distribution at the screen as:

$$E_{apr}(x) = \frac{\exp(k_m d)\cos(k_m x)}{d^2 + x^2}. \quad (20)$$

By synthesizing this field distribution at the plane of the screen, a close approximation of Equation (18) may be created at the image plane, thereby producing a sub-wavelength focus.

The field distribution of Equation (20) may be reconstructed borrowing concepts from holography. In holography, one makes a complete record of an object wavefront by interfering with the object wavefront with a reference wavefront. In the present invention, a normally incident plane wave was selected as a reference wave, and the holographic interference at the screen is expressed as:

$$T(x) \propto 1 + 2Re\{E_{obj}(x,z=-s-d)\} + |E_{obj}(x,z=-s-d)|^2 \quad (21)$$

To eliminate the constant transmission background, all terms apart from the second term in Expression (21) are suppressed to obtain:

$$T(x) \propto Re\{E_{obj}(x,z=-s-d)\} \quad (22)$$

As the object wavefront of Equation (20) is already real, Expression (22) readily simplifies to:

$$T(x) \propto E_{apr}(x). \quad (23)$$

Nevertheless, Expression (22) would apply for a general $E_{apr}(x)$ analytically or numerically solved for an arbitrary image field distribution.

An array of slot antennas over an infinite ground plane is used to convert a normally incident plane wave into the general transmission function $T(x)$ as specified in Expression (23). Since a slot antenna of a length below half wavelength is inductive, and one of length above half wavelength is capacitive, the respective radiated fields from these antennas will be $\pi$-shifted in phase, generating a sign change in $T(x)$. Furthermore, the field radiated from a slot antenna strengthens (or weakens) as its length gets closer to (or farther from) the half wavelength resonance. Thus, by controlling the slot dimensions to be above or below, and close to or far from resonance (nominally at half wavelength), one can reconstruct an arbitrary $T(x)$ upon normal plane wave incidence.

A metallic transmission screen was designed which tightly focuses a 10 GHz incident plane wave at a distance of 4.5 mm (0.15-wavelength) away from the screen. $k_m = 5k_0$ was selected to provide a 5-fold focal width improvement over a far-field diffraction-limited distribution. For simplicity, the screen was designed using only three slots (a 1.2 mm×13.2 mm central slot, and two 0.6 mm×17.0 mm side slots), as opposed to an infinite array of slots. These three slots were spaced at 3 mm (0.1-wavelength) apart. The central slot, which synthesized the positive peak of $T(x)$ at $x=0$, was slightly shorter than a half-wavelength, while the side slots, which synthesized the negative peaks of $T(x)$ at $x=\pm 3$ mm, were slightly longer than half-wavelength, but farther from the half-wavelength resonance so as to give a weaker transmission magnitude in comparison to the central slot.

FIG. 14 shows a diagram of the designed screen. Simulation using Ansoft's HFSS showed that the x-directed electric field (the dominant component of the electric field) forms a focus of only 4.9 mm, or 0.16-wavelength (electric field FWHM) at the image plane. A high level of focusing capability was achieved even with very few slots. The screen was fabricated by laser-cutting the designed slots from a stainless steel plate of a thickness of 6 mil (0.152 mm). The stainless steel plate was then stretched onto a frame to ensure its flatness.

Figure 15:
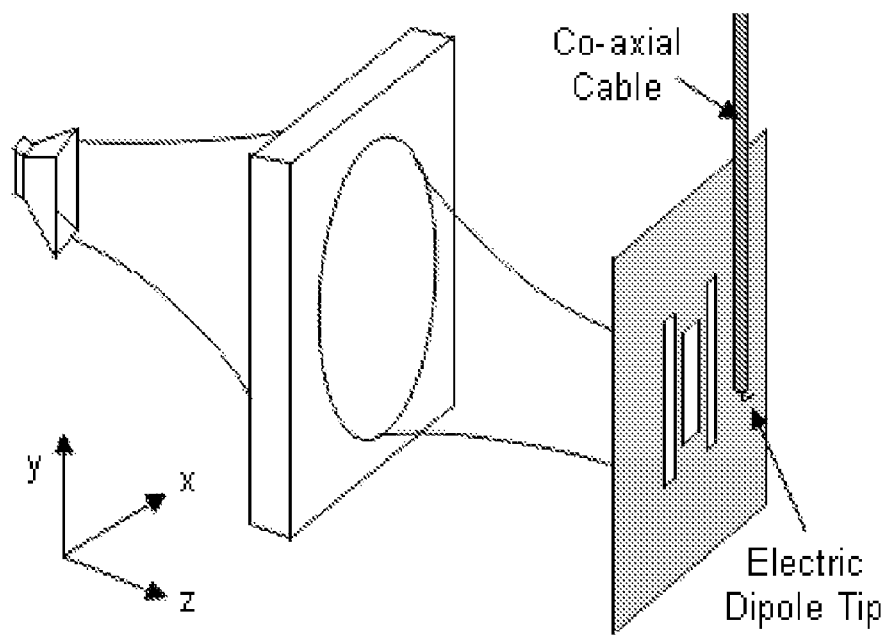
FIG. 15 is a schematic of the experimental apparatus.

FIG. 15 shows a schematic of the experimental apparatus. Port 1 of an Agilent E8364B Performance Network Analyzer ("PNA") drove an X-band horn, transmitting a spherical wave with the E-plane aligned in the x-direction. This wave was collimated by a Rexolite dielectric lens to form a Gaussian beam which closely approximated plane wave incidence at the screen. On the output side of the screen, the x-directed E-field was detected by a dipole probe, which was connected to port 2 of the PNA. The dipole probe was made from a EZ47 semi-rigid co-axial cable by Huber+Suhner.

Three automated $S_{21}$ scans were performed. Firstly, a scan over image plane, with all three slots unobstructed. Secondly, a scan over image plane with the two side slots covered with copper tape, leaving only the central slot. Thirdly, a scan without the screen for calibration purposes.

Figure 16:
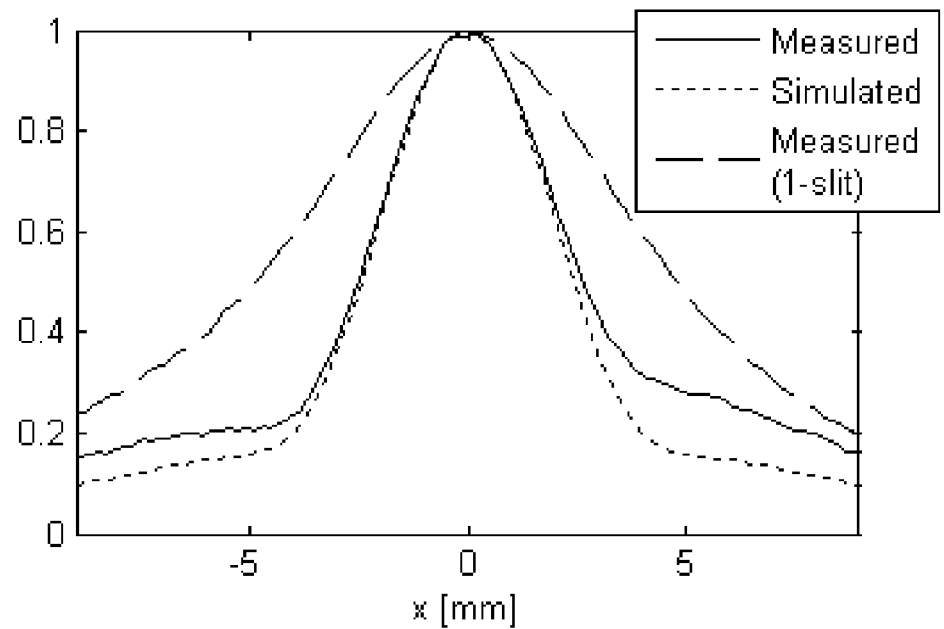
FIG. 16 is a chart of f$E_x$ (normalized) along the y=0 line on the image plane.

FIG. 16 shows the experimentally measured $E_x$ field distribution at the y=0 line over the image plane (solid line), compared alongside the same experimental measurement with the side slots covered (dash line), and a corresponding simulation using Ansoft's HFSS, where the metal ground plane is simulated as a perfect electric conductor (dotted line). The measured field distribution is asymmetric due to an unwanted direct coupling of fields into the co-axial cable. This spurious coupling was most severe when the co-axial cable was closest to the central slot, which correspondingly smoothed the +x direction of the plot, as can be deduced from the probing geometry shown in FIG. 15.

Using three slots, the x-directed E-field was focused to a FWHM of 5.2 mm (0.17-wavelength) at an image plane 4.5 mm (0.15-wavelength) from the screen at f=10 GHz, which agrees well with the simulation value of 0.16-wavelength, and shows a clear improvement from the FWHM of 9.8 mm (0.33-wavelength) obtained with the side slots covered.

The high degree of agreement between the measured focal width and the simulated focal width, obtained by using a PEC in place of a metallic ground plane, verifies the screen's focusing quality and the electric field intensity at the focal spot are only minimally affected by conductive loss in the stainless steel ground plane. In this respect, the proposed screen of the present invention is advantageous over most existing resonance-dependent sub-wavelength focusing structures, including metamaterial lenses, which suffer from a resolution limitation caused by losses accompanied by implicated resonances [A. Grbic and G. V. Eleftheriades, "Overcoming the diffraction limit with a planar left-handed transmission-line lens," *Phys. Rev. Lett.*, vol. 92, no. 11, pp. 117403, Mar. 19, 2004; A. Grbic and G. V. Eleftheriades, "Practical limitations of sub wavelength resolution using negative-refractive-Index transmission-line lenses," IEEE Trans. Antennas Propag., October 2005, vol. 53, no. 10, pp. 3201-3209].

Surprisingly, the sub-wavelength focusing screen of the present invention is able to enhance the electric field strength at the image plane. Since sub-wavelength focusing structures generate evanescent waves which rapidly decay towards the image plane, the field strength is often much weaker at the image plane than at the output surface of the structure. In this regard, the proposed metallic screen is no different. However, for the metallic screen, the resonant field coupling from the incident plane wave to the slot antennas boosts the field strength at the image plane, making the focal point field strength comparable to or stronger than that of the incident wave.

Figure 17:
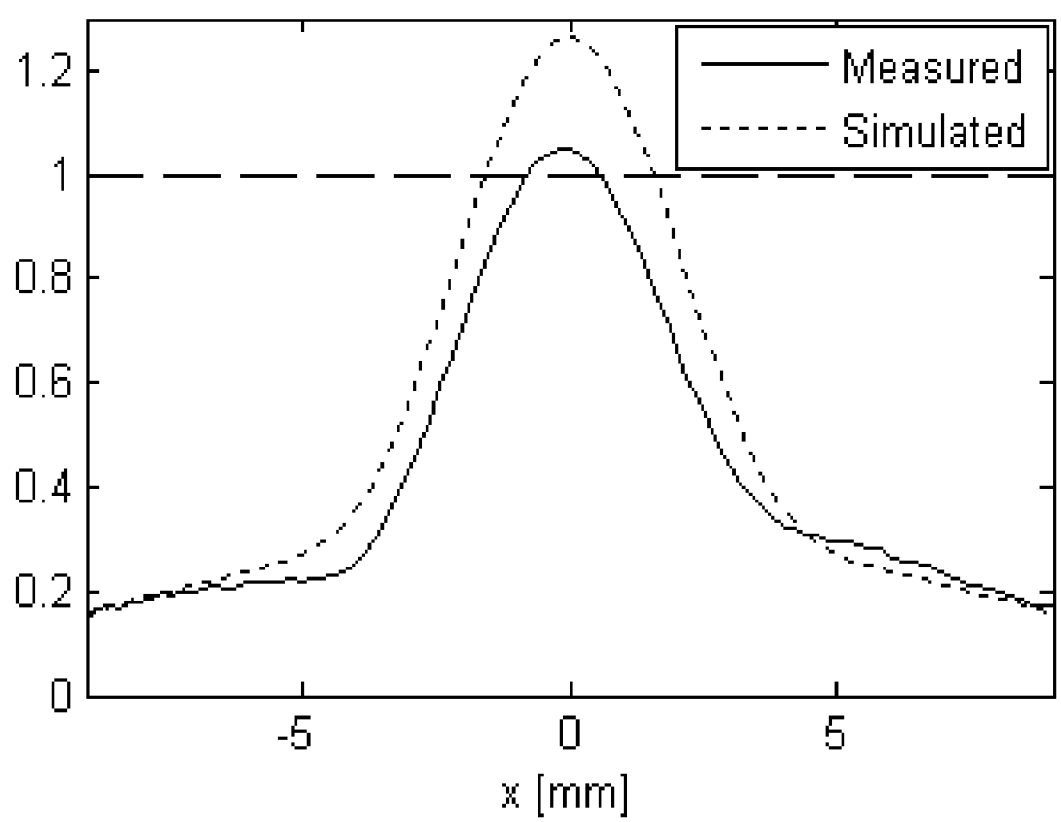
FIG. 17 is a chart of $E_x/E_0$ along the y=0 line on the image plane.

FIG. 17 compares the simulated and measured electric field distributions at the image plane, with both of them normalized to the incident electric field $E_0$. Apart from a slight attenuation, the experimental measurement closely matches the corresponding full-wave PEC screen simulation result. The measured peak field strength is 1.05 times the incident plane wave, verifying the screen's ability to enhance the transmitted electric field strength.

Example 3

One-Dimensional Focusing with Spatial Bean Shift

A different conceptual approach to synthesizing transmission screens that is both simple and intuitive, incorporating the superposition of properly weighted dipole slot antenna field patterns is demonstrated. The key enabling observation is that the beam patterns formed by displaced slot elements are spatially shifted in the near-field, allowing them to form a set of basis functions for a moment expansion synthesis of image-plane field distributions. This technique leads directly to physically realizable implementations and experimental validation that is not sensitive to loss and can be readily scaled up to optical frequencies.

Field patterns with subwavelength features contain spatial Fourier components with transverse propagation vectors $k_{xz}$ larger than $k=\omega\sqrt{\epsilon\mu}$. To satisfy Maxwell's equations, these components decay evanescently along y, and are therefore restricted to the near-field. Negative-refractive-index slabs can be used to recover the near-field through evanescent field amplification but the image resolution tends to be very sensitive to losses [J. B. Pendry, Phys. Rev. Lett. 85, 3966 (2000), A. Grbic and G. V. Eleftheriades, Phys. Rev. Lett. 92, 117403 (2004)]. Without such lenses, the image plane must remain close to the source since the field profile broadens quickly to the diffraction limit: Closely spaced dipole slots less than half a wavelength apart produce shifted beams that are weighted with out-of-phase currents to effectively increase the range in which the evanescent fields can be used to perform subwavelength focusing.

Figure 18:
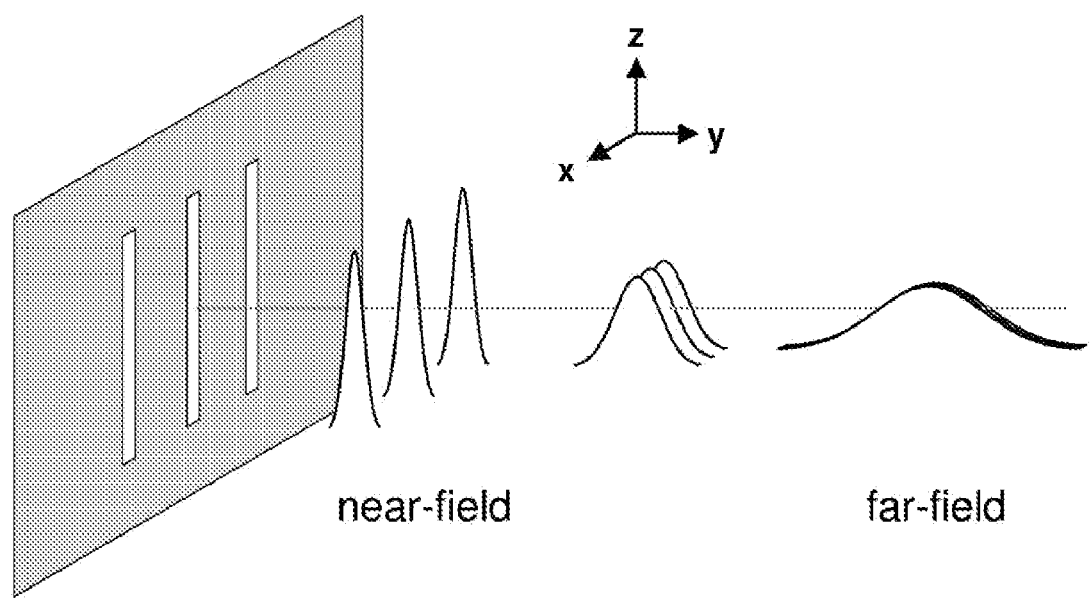
FIG. 18 depicts an array of dipole slots which produce shifted beams in the near-field but identical magnitude distributions in the far-field.

FIG. 18 shows a qualitative illustration of how an array of dipole slots produces shifted beams in the near-field but identical magnitude distributions in the far-field.

The electric field produced by an infinitesimally thin z-directed dipole slot antenna located at the origin is given in Equation (24) for a range of fields restricted to the xy-plane [C. A. Balanis, *Antenna Theory: Analysis and Design* (John Wiley & Sons, Inc., New York, 2004), 2nd ed.]. The slot is fed by a magnetic source current $I_m$, with the amplitude of the electric field related to the distance p from the center of the dipole and the phase related to the distance R from the tip of the dipole. In accordance with the restrictions imposed by the experimental setup, only the x-component of the electric field is considered in this Letter, but any other component of the electric field or magnetic field can be focused using the same principles outlined for $E_x$.

$$E_x(x,y,z) = \frac{I_m y}{j2\pi} \frac{e^{-jkR}}{\rho^2} = \frac{I_m y}{j2\pi} \frac{e^{-jk\sqrt{x^2+y^2+L^2/4}}}{x^2+y^2} \quad (24)$$

It is well known in optics and electromagnetics that the far-field distribution of a radiating system is simply the Fourier transform of the source field distribution [A. Yariv and P. Yeh, *Photonics: Optical Electronics in Modern Communications* (Oxford, N.Y., 2007), 6th ed.]. This implies that if a slot were moved from the origin to a new position x=d along the x-axis, the far-field pattern would experience only a phase shift, as shown in Equation (25a). The separation of the far-field into the product of an element factor given by Equation (24) and an array factor is not valid in the near-field, however. Indeed, the situation is distinctly different, giving us a new handle to manipulate the near-field for effects such as subwavelength focusing. The near-field distribution of an antenna element translated along the x-axis is the spatially shifted beam described by Equation (25b). The presence of strong evanescent waves produces fields that decay rapidly away from the slot element, leading to a localization of fields shifted away from the array origin. This is critical in providing sufficient amplitude variation to design a subwavelength focused beam. As the distance from the source increases, the shifted beams spread until they can no longer be distinguished from one another strictly on the basis of amplitude and the property of spatially shifted fields is lost, as demonstrated in FIG. 18.

$$E_{x,shifted}=E_x(x,y,z)e^{-jkd\cos\phi} \text{ (far field)} \quad (25a)$$

$$E_{x,shifted}=E_x(x-d,y,z) \text{ (near field)} \quad (25b)$$

For a source to focal plane separation of $y=0.15\lambda$, the individual dipole fields from a three-dipole array are plotted in FIG. 19a. By adjusting the complex weights on each of these element field profiles (FIG. 19b), the two satellite slots can be designed to destructively interfere with the central profile and produce a null in the total field close to the peak of the main lobe (FIG. 19c). As the distance between the nulls decreases, the main lobe beam width becomes smaller and the beam is more focused. A tradeoff is involved, however, since the element beam profiles are of finite width themselves, leading to increased side-lobe levels and higher main lobe attenuation relative to the constituent element fields. Increasing the number of elements can serve to lower the side lobes but a limit is reached as to the minimum focused beam width for a given inter-element spacing d.

The analytical formulation for the beam produced by a single slot can be extended to an linear array with an arbitrary number of slot elements. The total x-directed electric field for an array of N elements is given by Equation (26) where $w_n I_m$ is the $n^{th}$ weighted magnetic source current and x=nd is the position along the x-axis of the $n^{th}$ slot. In the vector representation, w is a N-element column vector containing the complex weights $w_n$, assigned to each slot and $E_x$ is a N-element row vector containing the fi from each element as a function of x.

Figure 19:
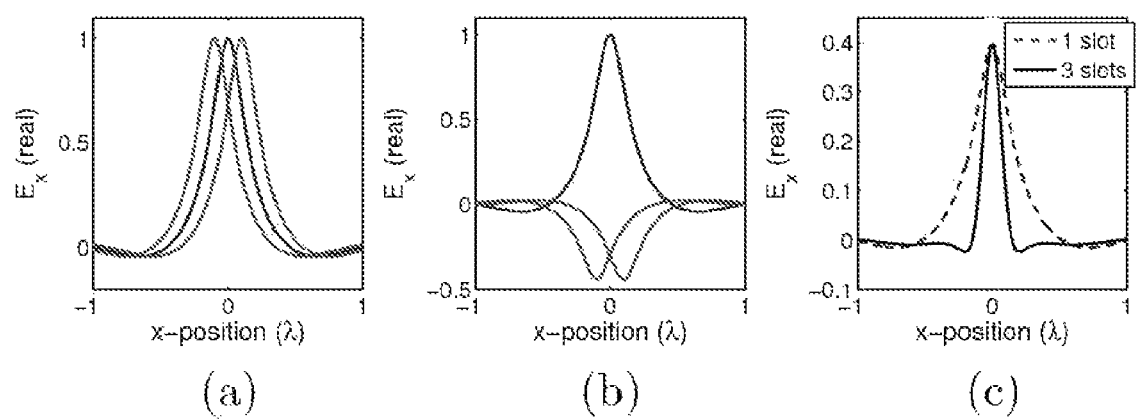
FIG. 19 illustrates subwavelength focusing from the superposition of shifted beams in the near-field: (a) Shifted beams from slots at x=−0.1λ (red), x=0 (blue), and x=0.1λ (green), (b) the shifted beams multiplied by their weighting factors, (c) The weighted shifted beams superposed to produce a subwavelength focused beam (solid) and the beam from a single slot (dashed)

FIG. 19 illustrates subwavelength focusing from the superposition of shifted beams in the near-field. The transverse electric field at $y=0.15\lambda$ is plotted at several conceptual stages. (a) Shifted beams from slots at $x=-0.1\lambda$ (red), x=0

(blue), and x=0.1λ (green). (b) The shifted beams multiplied by their weighting factors. (c) The weighted shifted beams superposed to produce a subwavelength focused beam (solid) and the beam from a single slot (dashed).

$$E_{x,total} = \sum_{n=-(N-1)/2}^{(N-1)/2} w_n \frac{I_m y}{j2\pi} \frac{e^{-jk\sqrt{(x-nd)^2+y^2+L^2/4}}}{(x-nd)^2+y^2} \quad (26)$$

$$= \sum_{n=-(N-1)/2}^{(N-1)/2} w_n E_{x,n} = E_x \cdot w$$

The weights $w_n$, are chosen to scale the individual slot electric field components $E_{x,n}$ to produce the desired electric field profile at the focal plane. In order to determine the optimal weights $w_{opt}$ necessary to approximate a desired electric field profile $f(x)$, the individual slot field components can be regarded as basis functions for a method of moments field expansion. By multiplying both sides of $f(x) \approx E_x \cdot w_{opt}$ by $E_{x,m}$ and integrating over x we are left with a system of N independent equations that can be solved for the N weights $w_n$, by reducing the problem to that of inverting an N×N matrix. Although these basis functions are linearly independent, they are not orthogonal so the off-diagonal terms of the matrix do not vanish and the analytic formulation becomes unwieldy. Instead, $f(x)$ and $E_{x,m}(x)$ can be written as column vectors $b=f[x]$ and $A=E_{x,n}[x]$ by discretizing them over x causing the method of moments to be reduced to the method of least squares with an expression for w given in Equation (27).

$$w_{opt} = (A^H A)^{-1} A^H \cdot b \quad (27)$$

The desired focusing effect is demonstrated using a Gaussian pulse with a full-width half-maximum (FWHM) beam width of 0.12λ as the target field profile for an array of three slots separated by d=0.1λ. The optimal weights were calculated using Equation (27) to be $w_0=1$ and $w_{\pm 1}=0.446 < 174°$ for a focal plane at y=0.15λ (FIG. 19c).

In order to show the increased focusing power of an array with more elements, the focal plane was moved to y=0.25λ where the beam width of a single slot is 0.5λ. The optimal weights were calculated for an N=3 and an N=9 array with d=0.1λ. The structure was simulated using Ansoft's HFSS full-wave finite-element software with the half-wavelength dipole slots fed by ideal x-directed voltage sources. The resulting field profiles matched very well with those calculated using Equation (26), converging to the analytical solution as the width of the simulated dipoles was reduced. The three-element array was able to produce a beam width of 0.250λ (FIG. 20a) while the nine-element array focused the beam further to a beam width of 0.144λ (FIG. 20b).

Figure 20:
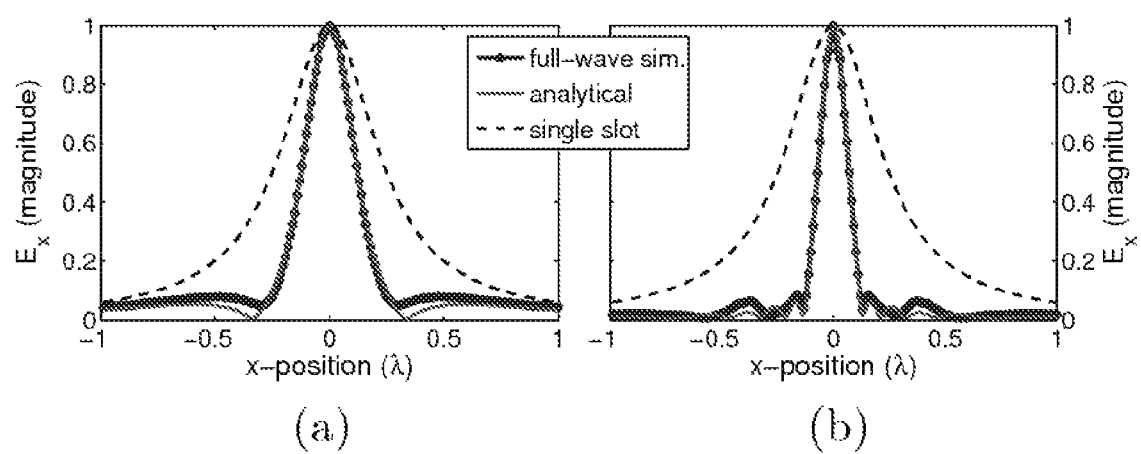
FIG. 20 illustrates simulated focused beams for slot arrays with 3 and 9 elements optimized for a focal plane at y=0.25λ, (a) three-element array with weights $w_0$=1 and $w_{\pm 1}$=0.497<172°, (b) nine-element array with weights $w_0$=1, $w_{\pm 1}$=0.764/179°, $w_{\pm 2}$=0.373<−2°, $w_{\pm 3}$=0.136<175°, and $w_{\pm 4}$=0.032<6°.

FIG. 20 illustrates simulated focused beams for slot arrays with 3 and 9 elements optimized for a focal plane at y=0.25λ. The thin red line was calculated analytically from Equation (26) while the thick blue line was extracted from a full-wave simulation. The dotted line indicates the beam formed 'from a single slot. (a) Three-element array with weights $w_0=1$ and $w_{\pm 1}=0.497 < 172°$. (b) Nine-element array with weights $w_0=1$, $w\pm i=0.764/179°$, $w_{\pm 2}=0.373 < -2°$, $w_{\pm 3}=0.136 < 175°$, and $w_{\pm 4}=0.032 < 6°$.

In a numerical implementation, Equation (27) must be calculated using a truncated range of x values, typically chosen such that the target field is very small at each endpoint. When the weights are optimized over a small portion of the target function, however, such as by truncating the range of x to those values falling within the target function's FWHM beam width, an arbitrarily narrow central beam can be formed for any $N \geq 3$ and any d. However, this co at the expense of extremely large side lobe amplitudes and high weight sensitivity, an observation reported in super-directive and super-oscillatory papers in the literature that can render ambitious applications of these procedures impractical [P. J. S. G. Ferreira and A. Kempf, IEEE Trans. Signal Processing 54, 3732 (2006), M. M. Dawoud and A. P. Anderson, IEEE Trans. Antennas Propagat. 26, 819 (1978)]. If the weights are instead optimized over several wavelengths in x, the side lobes are reduced to reasonable levels but the narrow beam width is no longer maintained. Increasing the number of elements reduces the side lobes further and allows a narrow beam width at more distant focal planes.

In order to realize this structure for a practical experiment, the ideal voltage sources at the centers of every slot were removed and plane wave incidence was considered. As demonstrated through full-wave simulations in [G. V. Eleftheriades and A. M. H. Wong, IEEE Microwave Wireless Compon. Lett. 18, 236 (2008).], the weights were implemented by changing the dimensions of each slot, with a narrower slot producing a lower amplitude electric field and a wider slot producing a higher amplitude electric field. Implementing the near 180° phase shift between adjacent slots was more challenging and necessitated increasing and decreasing the lengths of adjacent slots to produce inductive and capacitive slots that could resonate together. The final slot dimensions were optimized iteratively using full-wave simulations until the desired total field pattern was achieved. FIG. 21a and FIG. 21b present a cross-section of the fields produced by the slots for a single-slot and a triple-slot arrangement, respectively.

Figure 21:
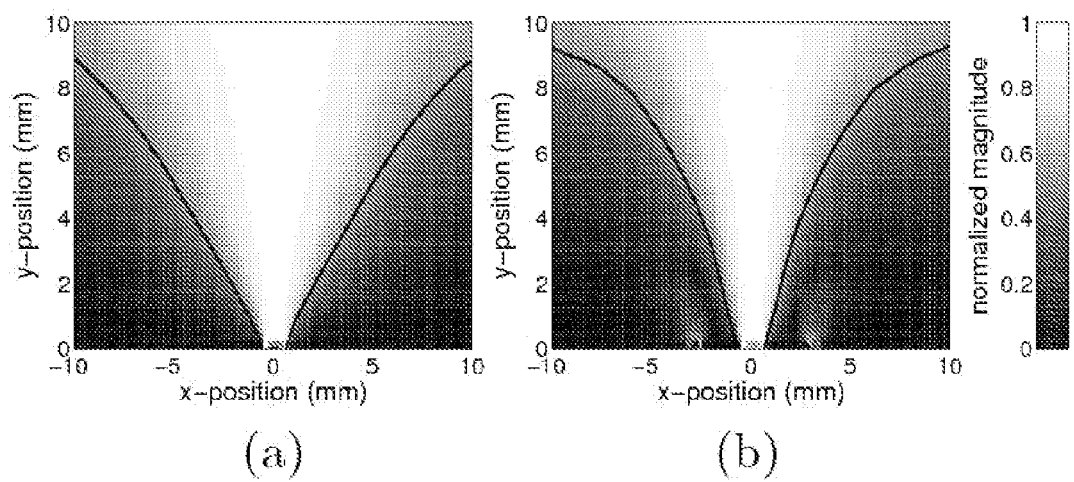
FIG. 21 shows simulated electric field magnitudes over the xy-plane for a single-slot (a) and a triple-slot (b) array under plane wave excitation at 10 GHz.

FIG. 21 shows simulated electric field magnitudes over the xy-plane for a single-slot (a) and a triple-slot (b) array under plane wave excitation at 10 GHz. The fields are normalized along the x-direction with respect to the field value at x=0 to highlight the profile of the beam. The thin black contour trace indicates the FWHM beam width.

Although not visible in the normalized data of FIG. 21, despite the presence of rapidly decaying evanescent fields, the focused electric field magnitude at the focal plane is 1.5 times the magnitude of the incident field due to slot resonances. The fields also show a similarity to those observed in negative-refractive-index slab focusing [A. Grbic and G. V. Eleftheriades, Phys. Rev. Lett. 92, 117403 (2004).]). The presence of evanescent field components in any type of near-field focusing implies that rather than producing a three-dimensional spot, the fields are confined only in the transverse direction [F. Mesa, M. J. Freire, R. Marqués, and J. D. Baena, Phys. Rev. B 72, 235117 (2005), A. Grbic, L. Jiang, and R. Merlin, Science 320, 511 (2008)]. One major advantage of the focusing screens over metamaterial lenses, however, is the fact that Ohmic losses occur only at the screen and not throughout a region of wave propagation. The structure is therefore insensitive to loss and, although much of the incident power is reflected at the screen, this in no way affects the focusing behavior. The simplicity of the slotted screen is also a distinct advantage over bulk metamaterials, allowing it to be easily scaled in frequency.

The dipole slots were created by cutting a three-dipole pattern in a 6 mil stainless steel sheet. The slots were designed to operate at 10 GHz with a central slot dimension of 13.2 mm×1.2 mm and a satellite slot dimension of 17 mm×0.6 mm spaced 3 mm away from the central slot. An X-band horn antenna with a Rexolite bicon vex lens was used to generate a collimated beam. The slot apertures were placed at the Gaussian beam waist, forming a very good approximation to a plane-wave. An Agilent E8364B network analyzer collected the field data over 8-12 GHz with one port connected to the horn antenna and the other port connected to a co-axial cable probe whose exposed inner conductor was bent ninety degrees to form a miniature dipole receiver antenna (see FIG. 22a inset). A custom built XYZ-stage from Newmark Systems positioned the probe over the screen with high precision to collect the near-field data on a plane 4.5 mm above the slotted sheet.

Figure 22:
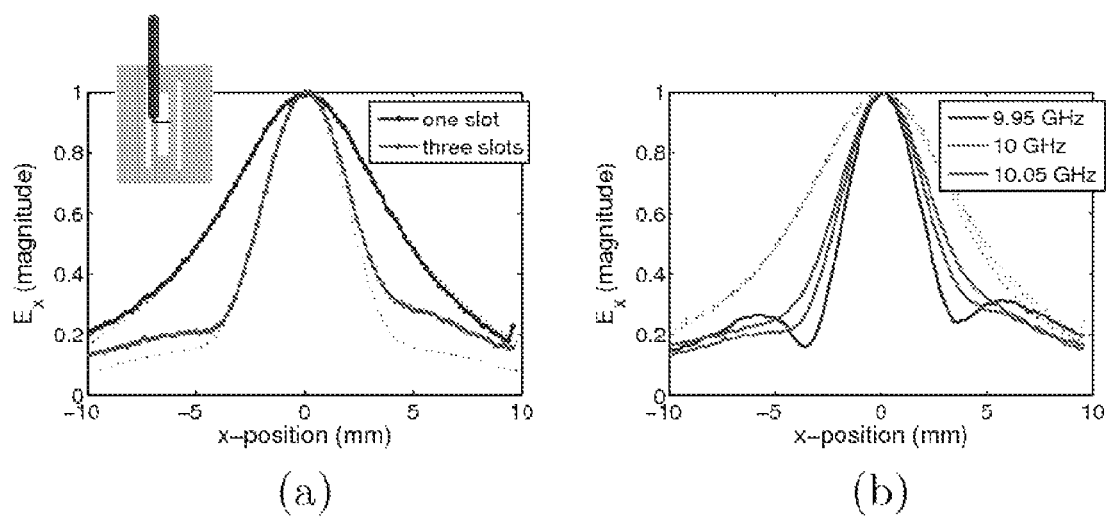
FIG. 22 illustrates (a) experimental measurements of the transverse electric field magnitude (solid lines) for single-slot and triple-slot arrays at 10 GHz compared with full-wave simulations (dotted), (b) measured field magnitudes at three frequencies for the single slot (dotted) and triple slot (solid) screens.

FIG. 22 illustrates (a) Experimental measurements of the transverse electric field magnitude (solid lines) for single-slot and triple-slot arrays at 10 GHz compared with full-wave simulations (dotted). The slight asymmetry in the measured field profile resulted from the asymmetrical coupling between the slots and the probe antenna (see inset). (b) Measured field magnitudes at three frequencies for the single slot (dotted) and triple slot (solid) screens.

To verify the experimental setup and calibrate the probe, the fields produced by the horn and lens setup were measured with the screen removed and found to be collimated at the screen plane. The transverse electric field was measured over the slots and the focused beam width was found to be 5.2 mm, which was within 6% of the simulated value of 4.9 mm. The two satellite slots were then covered with 3M copper tape and the measurements were retaken, resulting in a single-slot beam width of 9.7 mm, within 1% of the simulated value 9.6 mm. The measured beam width was reduced by a factor of 1.87 through the use of the two satellite slots (see FIG. 5a). In FIG. 5b, two other frequencies close to the design frequency are plotted to show the frequency dependence of the focusing screen.

These results demonstrate a shifted-beam approach to near-field focusing using slot antennas. Using an array of dipole slots weighted out-of-phase with respect to one another, a set of shifted beams is formed that yields a sub-wavelength focused beam through superposition. A moment-expansion method was developed to find the optimal weights given the number of elements, the element spacing, and the target field profile. Out-of-phase weights were implemented for plane-wave excitation using resonating inductive and capacitive slots. This led to experimental verification of the shifted-beam method for an N=3 array, with tighter focusing observed in simulations using larger arrays.

The inherent scalability of the slot apertures provides the opportunity to implement the focusing screen at frequencies ranging from microwaves to Terahertz and all the way up to the optical domain for corresponding applications such as high-resolution imaging and sensing. The dependence of the dipole slot behavior on plasma oscillations present in metals at optical frequencies can be readily accounted for by introducing an effective slot length that restores the scaled resonance frequency [L. Novotny, Phys. Rev. Lett. 98, 266802 (2007).]. This was successfully demonstrated in simulations at λ=830 nm with slots cut into a 40 nm silver slab. The increased subwavelength focusing range is very attractive for near-field imaging applications which are often constrained to working within an extremely small fraction of a wavelength away from the object to be imaged. The structure demonstrated can be used to resolve multiple objects in a variety of two-dimensional configurations with subwavelength precision by mechanically scanning the structure using orthogonal scanning patterns and detecting the back-scattered fields. For complete imaging, the structure can be extended fully to two dimensions by adding a second set of satellite slots offset slightly along x and shifted along z.

Example 4

Two Dimensional Focusing with Slotted Meta-Screen

In this example, the shifted-beam approach is extended to two-dimensions, leading to the development of a meta-screen that can focus an incident wave to a two-dimensional spot. With the focal plane pushed back to a distance of 0.25λ away from the screen, this structure shows a marked improvement, over the one-dimensional focusing structures presented in [A. Grbic, L. Jiang, and R. Merlin, "Near-field plates: subdiffraction focusing with patterned surfaces," Science, vol. 320, pp. 511-513, April 2008], [G V. Eleftheriades and A. M. H. Wong, "Holography-inspired screens for sub-wavelength focusing in the near field," IEEE Microwave Wireless Compon. Lett, vol. 18, no. 4, pp. 236-238, April 2008], [L. Markley. A. M. H. Wong, Y. Wang. and G. V. Eleftheriades, "A spatially shifted beam approach to subwavelength focusing," Phys. Rev. Lett. (in press).]. Composed of an array of slot antennas, the screen does not suffer from focal degradation due to losses and is scalable from microwave to Terahertz frequencies and beyond.

Figure 23:
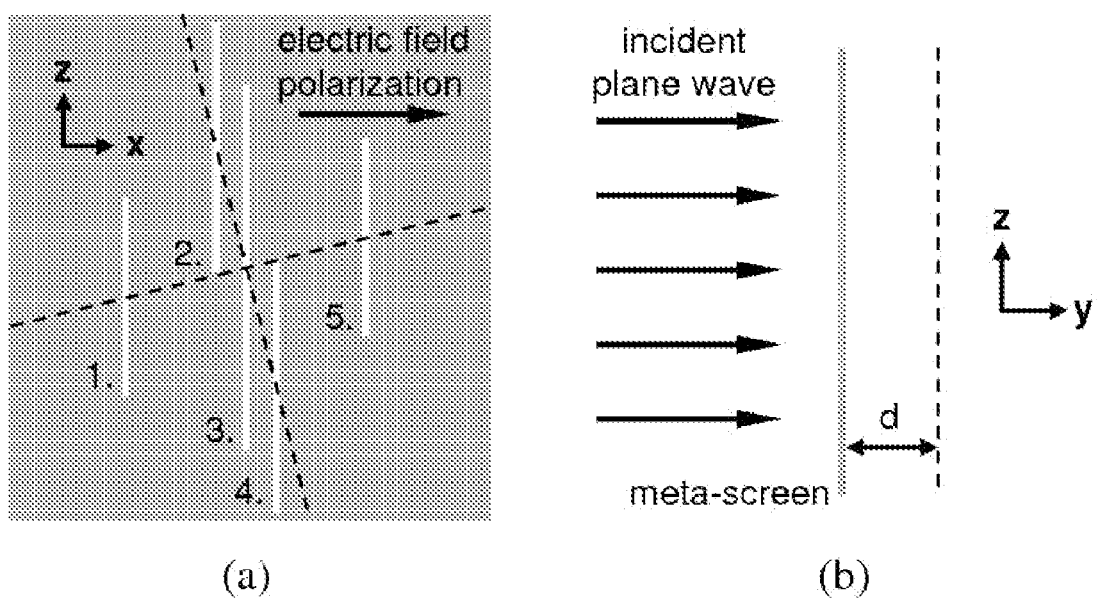
FIG. 23 illustrates (a) the geometry of the slotted meta-screen showing the numbering of the slots from one to five, (b) the meta-screen orientation with respect to the incident field.

FIG. 23 illustrates (a) The geometry of the slotted meta-screen showing the numbering of the slots from one to five. The slots are arranged along orthogonal focusing axes with their centers equidistant from the origin to provide two-dimensional focusing. (b) The meta-screen orientation with respect to the incident field. The electric field is polarized along the x-direction with the focal plane parallel to the screen but separated by a distance d.

The field pattern produced by an array of elements can ho analyzed by superposing the field patterns of each individual element. In the far field, this pattern can be separated into the pattern of an identical element located at the origin together with a phase correction factor that accounts for the element's actual position. In the near field, however, this "array factor" does not appear, and the field distribution is not shifted in phase but in space. This near-field property of spatially shifted beams can be utilized to synthesize field distributions such as subwavelength focal spots by appropriately weighting the shifted beams produced by closely spaced array elements and considering their superposition.

$$E_x|_{ff} = E_x(x,y,z) e^{-jkx_0 \sin\theta \cos\phi} e^{-jkz_0 \cos\theta} \tag{28a}$$

$$E_x|_{nf} = E_x(x-x_0, y, z-z_0) \tag{28b}$$

If $E_x$ (x, y, z) is the transverse electric field produced by a single z-directed slot element at the origin, then the fields in the near- and far-field regions produced by a slot shifted to a new location on the xz-plane ($x_0$ $z_0$) would be given by Equation (28a) and Equation (28b), respectively. Superposing the near-field contributions from N elements, each located at ($x_n$, $z_n$) and weighted by a complex constant factor $w_n$ produces a total field described by Equation (29). The vector representation condenses the fields from each element into an N-element row vector and the weights associated with each slot into an N-element column vector.

$$E_{x,total}(x, z) = \sum_{n=1}^{N} w_n E_x(x - x_n, y, z - z_n) \tag{29}$$

$$= \sum_{n=1}^{N} w_n E_{x,n}(x, z) = E_x \cdot w$$

Given a target field distribution f(x, z); the objective is to choose optimal weights w such that $E_x(x,z) W_{opt} \approx f(x, z)$. By multiplying both sides of the approximation by $\bar{E}_{x,m}(x, z)$ and integrating over x and z for all m, a set of N independent equations is created. This can be recognized as a method of moments field expansion using the individual element current distributions as basis functions and field patterns as testing functions. Discretizing $E_{x,n}(x, z)$ and f(x,z) over x and z and writing them as the column vectors in A and b, respectively, the optimal weights can be calculated using Equation 30.

$$w_{opt} = (A^H A)^{-1} A^H \cdot b \tag{30}$$

One-dimensional focusing has been demonstrated using an array of three slots spaced by $\lambda/10$ but a direct extension to two-dimensions could not be applied without causing the half wavelength slots to overlap longitudinally. By rotating the focal axes slightly, however, as illustrated in FIG. 23a, a geometry was found that still permits tight slot spacings. The centers of the four satellite slots are located in the xz-plane at $(-0.20\lambda, -0.05\lambda)$, $(-0.05\lambda, 0.20\lambda)$, $(0.05\lambda, -0.20\lambda)$, and $(0.20\lambda, 0.05\lambda)$.

The optimal weights were calculated using Equation 30 for a focal plane $0.25\lambda$ away from the screen and a target Gaussian distribution with a full-width half-maximum (FWHM) beam width of $0.2\lambda$. Normalized with respect to the central slot weighting factor, the weights of the satellite slots were calculated to be $w_1 = w_5 = 0.271 < 170.2°$ for the slots along the x-directed focal axis and $w_2 = w_4 = 0.306 < 173.5°$ for the slots along the z-directed focal axis. Full-wave simulations using Ansoft's HFSS of very thin slots fed by voltage sources confirmed the theoretical results.

To perform experimental verification of the focusing array, plane-wave incidence was considered. The alternating signs of the weights were implemented by lengthening the central slot to make it capacitive and shortening the satellite slots to make them inductive. The mutual coupling between the closely spaced slots caused them to resonate strongly and contributed to the lowered amplitude of the fields produced from the satellite slots. The complete 5×5 admittance matrix was calculated using self and mutual admittance equations [G. V. Eleftheriades and G. M. Rebeiz, "Self and mutual admittance of slot antennas on a dielectric half-space," *International Journal of Infrared and Millimeter Waves*, vol. 14. no. 10, pp. 1925-1946, 1993] for a variety of slot lengths while the induced slot currents were determined by integrating the assumed magnetic current distribution over the incident field. The lengths corresponding closely to the optimal weights were optimized through simulations using the Multiradius Bridge Current software that implements a thin-wire formulation of the electromagnetic moment method [M. A. Tilston and K. 0. Balmain, "A multiradius, reciprocal implementation of the thin-wire moment method," *IEEE Trans. Antennas Propagat.*, vol. 38, no. 10, pp. 1636-1644, October 1990]. The final set of lengths was determined to be $L_1 = L_5 = 0.330\lambda$, $L_2 = L_4 = 0.415\lambda$, and $L_3 = 0.6075\lambda$ with the widths all set to $0.01\lambda$. These dimensions were successfully verified in HFSS to produce a subwavelength focal spot.

Figure 24:
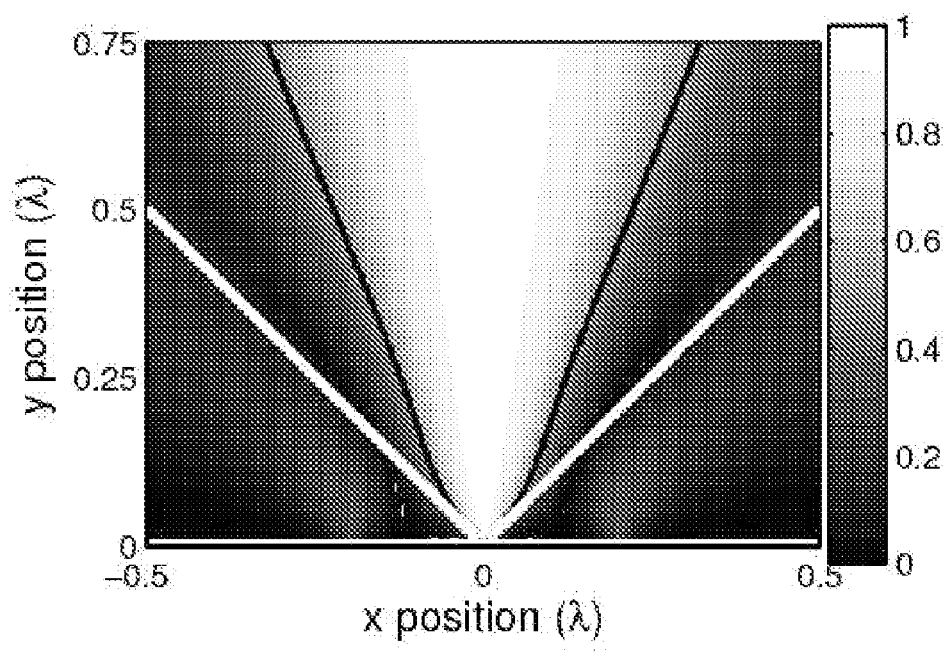
FIG. 24 shows full-wave simulations of the electric field magnitude under plane wave excitation, the xy-plane is shown in (a) with the xy-plane in (b.
Figure 24:
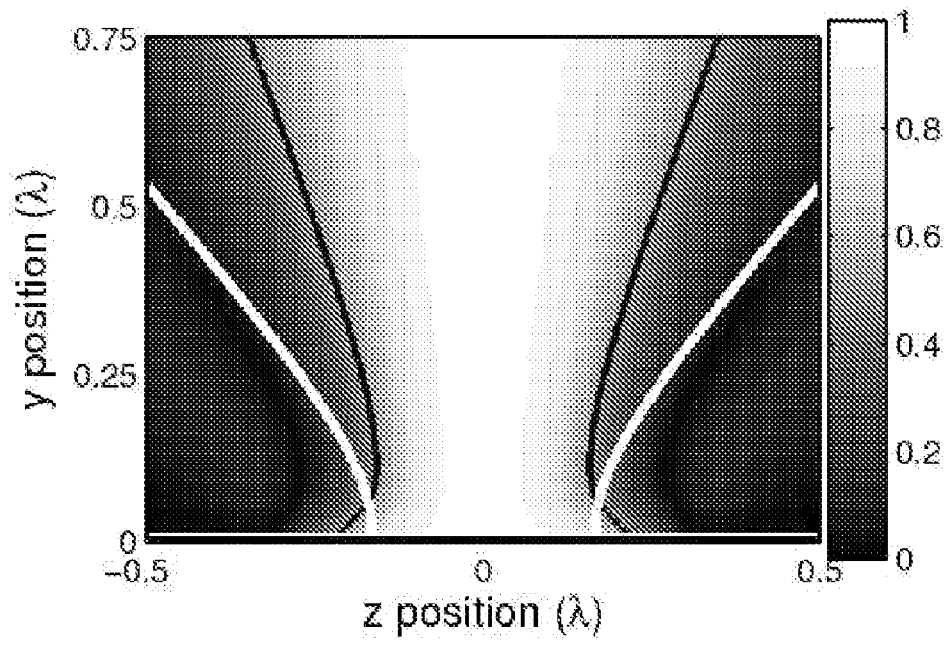

The field profile as it progresses away from the screen is shown in FIG. 24. It is to be noted that although there is subwavelength confinement of the electric field along both transverse axes, there is none along the longitudinal y-axis. This is a fundamental restriction imposed by Maxwell's equations that has been observed in all sub-diffraction limited focusing experiments [F. Mesa, M. J. Freire, R. Marqués, and J. D. Baena, "Three-dimensional superresolution in metamaterial slab lenses: experiment and theory," *Phys. Rev. B*, vol. 72, p. 235117, December 2005].

FIG. 24 shows full-wave simulations of the electric field magnitude emanating from the men-screen under plane wave excitation. The fields are normalized transverse to the y-axis at every y position to highlight the profile of the beam as it progresses away from the screen—The xy-plane is shown in (a) with the xy-plane in (b). The thinner black contour indicates the FWHM beam width of the focused beam while the thick white contour indicates the FWHM beam width of a single slot.

The meta-screen was fabricated from a sheet of 2 mil stainless steel cut using a laser with a cutting accuracy of 5 μm. At 10 GHz, the slot dimensions are 9.9 mm×0.3 mm, 12.45 mm×0.3 mm, and 18.225 mm×0.3 mm with the centers of the satellite slots spaced 6 mm×1.5 mm away from the center of the central slot. A plane wave excitation was produced by collimating the beam from an X-band horn antenna through a Rexolite biconvex lens and placing the screen at the Gaussian beam waist. An Agilent E8364B network analyzer was used to collect the field data by recording the transmission scattering parameters between the horn antenna and a co-axial cable probe whose exposed inner conductor was bent 90 degrees to form a miniature dipole receiver antenna (see FIG. 25 inset). A high-precision custom built XYZ-stage from Newmark Systems positioned the probe to collect the transverse electric field data on a plane 7.5 mm above the surface of the screen.

Figure 25:
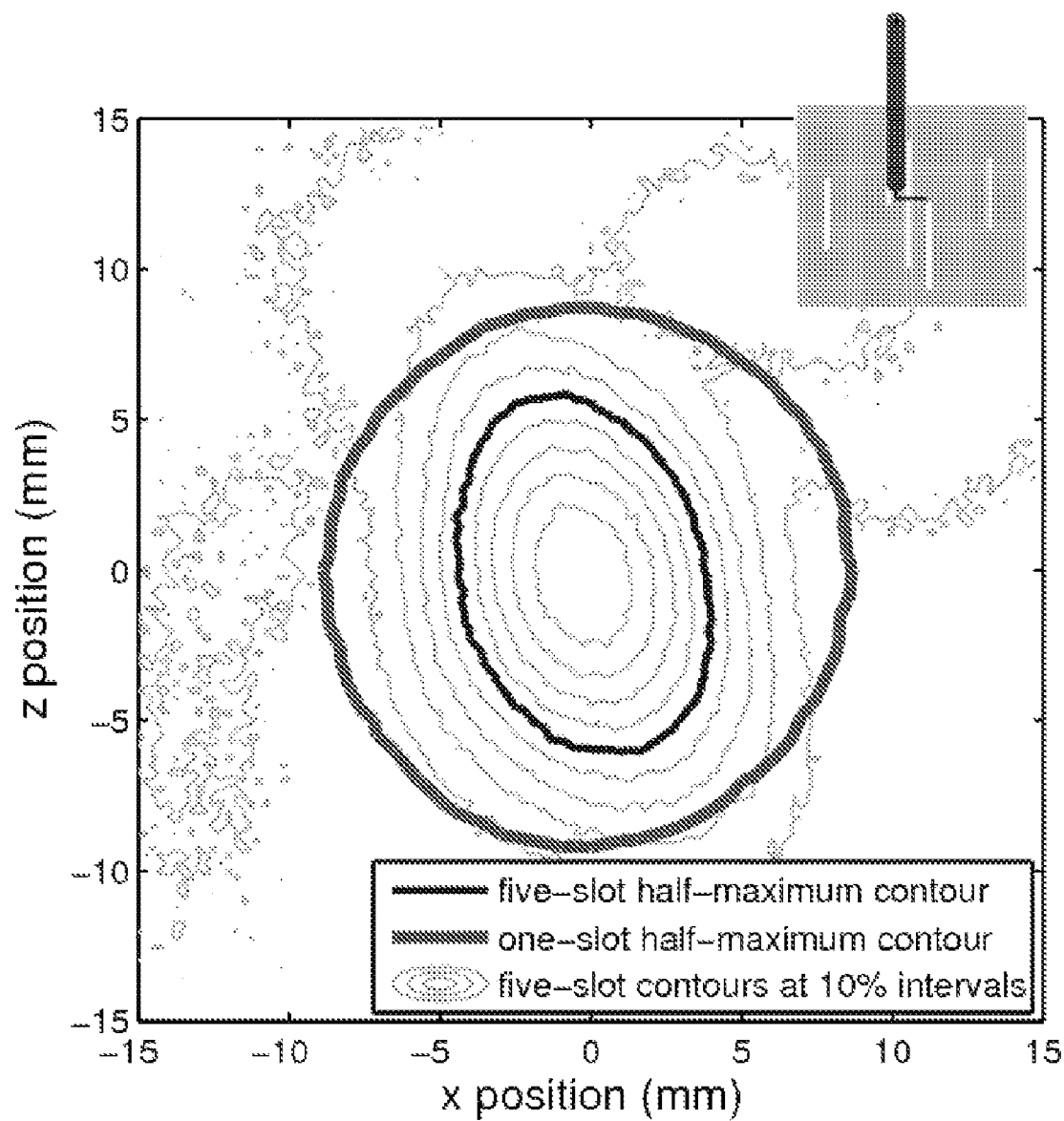
FIG. 25 shows experimental measurements of the electric field at 100 Hz over a plane 7.5 mm away from the screen.

FIG. 25 shows experimental measurements of the electric field at 100Hz over a plane 7.5 mm away from the screen. The thin blue contours are spaced at 10% intervals from 10% to 90% of the peak magnitude while the thicker blue oval contour represents the FWHM focal spot. The thick red round contour represents the FWHM focal spot of the diffraction limited beam produced by a single slot. Asymmetries in the measured field profile were exacerbated by the asymmetric coupling between the probe antenna and the slots (see inset).

Figure 26:
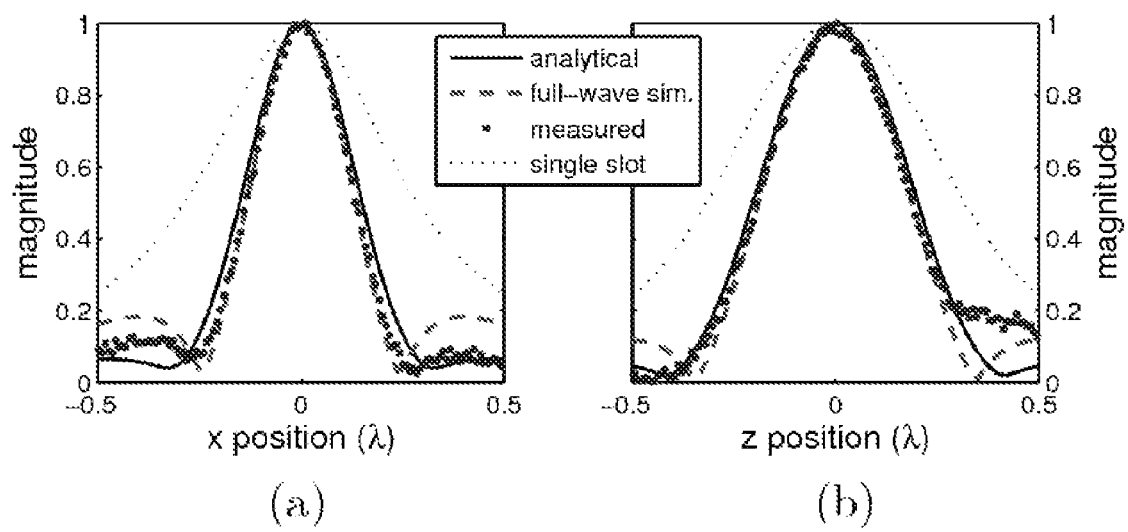
FIG. 26 shows a comparison of the field profiles along the c-axis (a) and the z axis (b).

The meta-screen field measurements were compared to the field produced by a single slot, which has broadened to the diffraction limit at a distance of $\lambda/4$, and to the background field measured with the screen removed. The peak field magnitude from the single slot was 7.8 dB lower than the background field while the focused beam peak magnitude was 15.4 dB lower than the background field. The focused FWHM beam width along the c-axis was measured to be $0.271\lambda$ (2.16 times smaller than the single-slot FWHM beam width) and along the z-axis to be $0.385\lambda$ (1.56 times smaller than that of the single slot). FIG. 26 presents the analytical predictions together with the simulation results and experimental measurements. The close agreement between the simulation data, in which losses were not taken into account, and the measurement data indicates that the performance of the meta-screen is not affected by the introduction of losses.

FIG. 26 shows a comparison of the field profiles along the c-axis (a) and the z axis (b). Measured data is plotted alongside full-wave simulation data and analytical predictions, with the diffraction limited beam from a single slot—given for comparison. The focal plane of the analytic and simulation data was moved to 0.28) so the single-slot data would be consistent with the measurements.

In summary, a meta-screen was designed to produce a two dimensional subwavelength focal spot $0.25\lambda$ away from the screen in response to a plane wave excitation. A shifted-beam approach to near-field focusing was used to develop the structure out of an array of closely spaced slot antennas. The element field patterns were weighted out-of-phase by changing the lengths of the slots so they would resonate together. Full-wave simulations were performed to verify the focusing behavior followed by confirmation through experimental measurements at 10 GHz. The advantages of the metascreen over alternative implementations relate primarily to its simplicity, which allows it to be easily scaled in frequency and to be resistant to focal degradation in the presence of losses. Furthermore, in contrast to high resolution imaging methods such as near-field optical microscopy where the probe operating distance needs to be as small as $\lambda/100$ and only surface details can be resolved, this structure can be placed a distance of $\lambda/4$ away from the object to be imaged.

It will be appreciated by those skilled in the art that other variations of the preferred embodiment may also be practiced without departing from the scope of the invention.

What is claimed is:

1. A device for focusing an incident electromagnetic plane wave having a frequency of between $10^3$ and $10^{15}$ Hertz, the device comprising a ground plane having a plurality of parallel slots cut therein selectively positioned to focus the plane wave in the near field focal plane into spots which have a maximum diameter less than the wavelength of the plane wave, wherein each slot is of differing length than each other slot.

2. The device of claim 1 characterized in that the ground plane is a metallic screen.

3. The device of claim 1 characterized in that the plurality of slots comprises at least three slots.

4. The device of claim 1 characterized in that the plurality of slots comprises a central slot and a pair of lateral slots, one on either side of the central slot, each slot having a length of between $0.95\lambda$ and $1.05\lambda$.

5. The device of claim 1 characterized in that the arrangement of slots is selected such that inductive and capacitive slots are adjacent one another.

6. A method of focusing electromagnetic waves into spots in the near-field plane, comprising directing an incident electromagnetic plane wave towards a ground plane, the ground plane having a plurality of parallel slots cut therein, wherein each slot is of differing length than each other slot.

7. The method of claim 6 wherein the ground plane is a metallic screen.

8. The method of claim 6 characterized in that each of the plurality of slots comprises a central slot and a pair of lateral slots, one on either side of the central slot, each slot having a length of between $0.95\lambda$ and $1.05\lambda$.

9. The method of claim 6 characterized in that the frequency of the electromagnetic waves is between $10^3$ and $10^{15}$ Hertz.

10. The method of claim 6 characterized in that variation of the amount of loss at the screen does not alter the diameter of each spot.

11. A method for fabrication of the screen of claim 1 comprising the following steps:
selecting a plate of stainless steel having of a desired thickness;
laser cutting a plurality of slots into the plate; and
stretching the plate on a frame.

12. The device of claim 1 for increasing the field strength at the image plane in an electromagnetic wave focusing system.

13. The use of the method of claim 6 for microwave imaging.

14. The use of the device of claim 1 for microwave imaging.

15. The use of the method of claim 6 for lithography.

16. The use of the device of claim 1 for lithography.

17. The use of the method of claim 6 for sensing.

18. The use of the device of claim 1 for sensing.

19. The use of the method of claim 6 for microscopy.

20. The use of the device of claim 1 for microscopy.

21. The use of the method of claim 6 for detection.

22. The use of the device of claim 1 for detection.

23. The use of the device of claim 1 for focusing an incident electromagnetic plane wave in two dimensions, both azimuth and elevation.

24. The method of claim 6, wherein the focusing is in two dimensions, azimuth and elevation.

25. A device for focusing in two dimensions an incident electromagnetic plane wave having a frequency of between $10^3$ and $10^{15}$ Hertz, the device comprising a ground plane having a plurality of parallel slots cut therein selectively positioned to focus the plane wave in the near field focal plane into spots which have a maximum diameter less than the wavelength of the plane wave, wherein each slot is of differing length than each other slot.

* * * * *